(12) United States Patent
Leidholm et al.

(10) Patent No.: US 8,198,117 B2
(45) Date of Patent: Jun. 12, 2012

(54) PHOTOVOLTAIC DEVICES WITH CONDUCTIVE BARRIER LAYERS AND FOIL SUBSTRATES

(75) Inventors: Craig R. Leidholm, Sunnyvale, CA (US); Brent Bollman, San Jose, CA (US); James R. Sheats, Palo Alto, CA (US); Sam Kao, Los Altos, CA (US); Martin R. Roscheisen, San Francisco, CA (US)

(73) Assignee: Nanosolar, Inc., San Jose, CA (US)

( * ) Notice: Subject to any disclaimer, the term of this patent is extended or adjusted under 35 U.S.C. 154(b) by 692 days.

(21) Appl. No.: 12/064,031

(22) PCT Filed: Aug. 16, 2006

(86) PCT No.: PCT/US2006/031906
§ 371 (c)(1),
(2), (4) Date: Aug. 18, 2008

(87) PCT Pub. No.: WO2007/022221
PCT Pub. Date: Feb. 22, 2007

(65) Prior Publication Data
US 2008/0308148 A1 Dec. 18, 2008

(51) Int. Cl.
*H01L 21/02* (2006.01)
(52) U.S. Cl. ............ 438/57; 438/64; 136/260; 136/261; 136/263; 136/264; 136/265
(58) Field of Classification Search .................. 136/244, 136/260–265; 438/57, 64
See application file for complete search history.

(56) References Cited

U.S. PATENT DOCUMENTS

| | | | |
|---|---|---|---|
| 3,423,301 A | 1/1969 | Sterns | |
| 3,586,541 A | 6/1971 | Chamberlin | |
| 3,818,324 A | 6/1974 | Espinasse | |
| 3,903,427 A | 9/1975 | Pack | |
| 3,903,428 A | 9/1975 | DeJong | |
| 3,966,499 A | 6/1976 | Yasui | |
| 3,966,568 A | 6/1976 | Crossley et al. | |
| 4,191,794 A | 3/1980 | Shirland et al. | |

(Continued)

FOREIGN PATENT DOCUMENTS

CN 1036298 A 10/1998
(Continued)

OTHER PUBLICATIONS

J. Jay Wimer in "3-D Chip Scale with Lead-Free Processes" in Semiconductor International, Oct. 1, 2003.

(Continued)

*Primary Examiner* — Basia Ridley
*Assistant Examiner* — Christina Chern

(57) ABSTRACT

Methods and devices are provided for absorber layers formed on foil substrate. In one embodiment, a method of manufacturing photovoltaic devices may be comprised of providing a substrate comprising of at least one electrically conductive aluminum foil substrate, at least one electrically conductive diffusion barrier layer, and at least one electrically conductive electrode layer above the diffusion barrier layer. The diffusion barrier layer may prevent chemical interaction between the aluminum foil substrate and the electrode layer. An absorber layer may be formed on the substrate. In one embodiment, the absorber layer may be a non-silicon absorber layer. In another embodiment, the absorber layer may be an amorphous silicon (doped or undoped) absorber layer. Optionally, the absorber layer may be based on organic and/or inorganic materials.

50 Claims, 6 Drawing Sheets

U.S. PATENT DOCUMENTS

| | | |
|---|---|---|
| 4,192,721 A | 3/1980 | Fawcett et al. |
| 4,227,942 A | 10/1980 | Hall |
| 4,243,432 A | 1/1981 | Jordan |
| 4,404,422 A | 9/1983 | Green et al. |
| 4,485,264 A | 11/1984 | Izu et al. |
| 4,499,658 A | 2/1985 | Lewis |
| 4,522,663 A | 6/1985 | Ovshinsky et al. |
| 4,536,607 A | 8/1985 | Wiesmann |
| 4,559,924 A | 12/1985 | Wilhelm |
| 4,574,160 A | 3/1986 | Cull |
| 4,605,813 A * | 8/1986 | Takeuchi et al. ............. 136/244 |
| 4,622,432 A | 11/1986 | Yamazaki |
| 4,642,140 A | 2/1987 | Noufi et al. |
| 4,677,250 A | 6/1987 | Barnett et al. |
| 4,755,475 A | 7/1988 | Kiyama et al. |
| 4,773,944 A | 9/1988 | Nath |
| 4,786,607 A | 11/1988 | Yamazaki et al. |
| 4,806,436 A | 2/1989 | Tada et al. |
| 4,849,029 A | 7/1989 | Delahoy |
| 4,860,509 A | 8/1989 | Laaly et al. |
| 4,865,999 A | 9/1989 | Xi et al. |
| 4,872,925 A | 10/1989 | McMaster |
| 4,940,604 A | 7/1990 | Suyama et al. |
| 4,981,525 A | 1/1991 | Kiyama et al. |
| 5,045,409 A | 9/1991 | Eberspacher et al. |
| 5,057,163 A | 10/1991 | Barnett |
| 5,078,804 A | 1/1992 | Chen et al. |
| 5,093,453 A | 3/1992 | St. Clair et al. |
| 5,139,959 A | 8/1992 | Craft et al. |
| 5,141,564 A | 8/1992 | Chen et al. |
| 5,244,509 A | 9/1993 | Arao et al. |
| 5,254,179 A | 10/1993 | Ricaud et al. |
| 5,268,037 A | 12/1993 | Glatfelter |
| 5,277,786 A | 1/1994 | Kawakami |
| 5,286,306 A | 2/1994 | Menezes |
| 5,356,839 A | 10/1994 | Tuttle et al. |
| 5,401,573 A | 3/1995 | Babel et al. |
| 5,419,781 A | 5/1995 | Hamakawa et al. |
| 5,421,908 A | 6/1995 | Yoshida et al. |
| 5,436,204 A | 7/1995 | Albin et al. |
| 5,441,897 A | 8/1995 | Noufi et al. |
| 5,468,652 A | 11/1995 | Gee |
| 5,501,744 A | 3/1996 | Albright |
| 5,547,516 A | 8/1996 | Luch |
| 5,558,723 A | 9/1996 | Ufert |
| 5,578,503 A | 11/1996 | Karg et al. |
| 5,587,264 A | 12/1996 | Iijima et al. |
| 5,626,686 A | 5/1997 | Yoshida |
| 5,626,688 A | 5/1997 | Probst et al. |
| 5,633,033 A | 5/1997 | Nishitani et al. |
| 5,637,537 A | 6/1997 | Nath et al. |
| 5,667,596 A | 9/1997 | Tsuzuki et al. |
| 5,674,325 A | 10/1997 | Albright et al. |
| 5,677,250 A | 10/1997 | Knapp |
| 5,679,176 A | 10/1997 | Tsuzuki et al. |
| 5,681,402 A | 10/1997 | Ichinose et al. |
| 5,730,852 A | 3/1998 | Bhattacharya et al. |
| 5,733,381 A | 3/1998 | Ota et al. |
| 5,735,966 A | 4/1998 | Luch |
| 5,759,291 A | 6/1998 | Ichinose et al. |
| 5,865,904 A | 2/1999 | Tanda |
| 5,868,869 A | 2/1999 | Albright et al. |
| 5,897,715 A | 4/1999 | Ward et al. |
| 5,925,228 A | 7/1999 | Panitz et al. |
| 5,928,439 A | 7/1999 | Ota et al. |
| 5,951,786 A | 9/1999 | Gee et al. |
| 5,985,691 A | 11/1999 | Basol et al. |
| 5,994,163 A | 11/1999 | Bodegard et al. |
| 6,034,322 A | 3/2000 | Pollard |
| 6,034,810 A | 3/2000 | Robinson et al. |
| 6,083,801 A | 7/2000 | Ohtani |
| 6,107,562 A | 8/2000 | Hashimoto |
| 6,121,541 A | 9/2000 | Arya |
| 6,124,039 A | 9/2000 | Goetz et al. |
| 6,127,202 A | 10/2000 | Kapur et al. |
| 6,130,465 A | 10/2000 | Cole |
| 6,201,181 B1 | 3/2001 | Azzam et al. |
| 6,239,352 B1 | 5/2001 | Luch |
| 6,265,652 B1 | 7/2001 | Kurata et al. |
| 6,268,014 B1 | 7/2001 | Eberspacher et al. |
| 6,333,206 B1 | 12/2001 | Ito et al. |
| 6,359,209 B1 | 3/2002 | Glenn et al. |
| 6,372,538 B1 | 4/2002 | Wendt et al. |
| 6,414,235 B1 | 7/2002 | Luch |
| 6,437,231 B2 | 8/2002 | Kurata et al. |
| 6,455,347 B1 | 9/2002 | Hiraishi et al. |
| 6,459,032 B1 | 10/2002 | Luch |
| 6,468,828 B1 | 10/2002 | Glatfelter et al. |
| 6,511,861 B2 | 1/2003 | Takeyama et al. |
| 6,553,729 B1 | 4/2003 | Nath et al. |
| 6,573,445 B1 | 6/2003 | Burgers |
| 6,729,081 B2 | 5/2004 | Nath et al. |
| 6,750,662 B1 | 6/2004 | Van Der Heide |
| 6,774,497 B1 | 8/2004 | Qi et al. |
| 6,787,405 B2 | 9/2004 | Chen |
| 6,803,513 B2 | 10/2004 | Beernink et al. |
| 6,846,696 B2 | 1/2005 | Adachi et al. |
| 6,974,976 B2 | 12/2005 | Hollars |
| 7,122,398 B1 | 10/2006 | Pichler |
| 7,144,751 B2 | 12/2006 | Gee et al. |
| 7,170,001 B2 | 1/2007 | Gee et al. |
| 7,276,724 B2 | 10/2007 | Sheats et al. |
| 7,507,903 B2 | 3/2009 | Luch |
| 7,507,971 B2 | 3/2009 | Shibayama et al. |
| 7,635,810 B2 | 12/2009 | Luch |
| 7,732,243 B2 | 6/2010 | Luch |
| 7,898,053 B2 | 3/2011 | Luch |
| 7,898,054 B2 | 3/2011 | Luch |
| 2001/0020486 A1 | 9/2001 | Tsuge |
| 2002/189662 A1 | 12/2002 | Lomparski |
| 2003/0103181 A1 | 6/2003 | Imayama et al. |
| 2003/0198587 A1 | 10/2003 | Kaloyeros |
| 2003/0205270 A1 | 11/2003 | Stanbery |
| 2003/0227021 A1 | 12/2003 | Yamazaki et al. |
| 2004/0063320 A1 * | 4/2004 | Hollars ........................ 438/689 |
| 2004/0069340 A1 | 4/2004 | Luch |
| 2004/0144419 A1 | 7/2004 | Fix |
| 2004/0187917 A1 * | 9/2004 | Pichler .......................... 136/263 |
| 2004/0214409 A1 | 10/2004 | Farnworth et al. |
| 2004/0219730 A1 | 11/2004 | Basol |
| 2004/0261839 A1 | 12/2004 | Gee et al. |
| 2004/0261840 A1 | 12/2004 | Schmit et al. |
| 2005/0006714 A1 | 1/2005 | Graetzel et al. |
| 2005/0061363 A1 | 3/2005 | Ginley et al. |
| 2005/0072457 A1 | 4/2005 | Glenn |
| 2005/0087225 A1 | 4/2005 | Morooka |
| 2005/0109392 A1 | 5/2005 | Hollars |
| 2005/0117194 A1 | 6/2005 | Kim et al. |
| 2005/0121068 A1 | 6/2005 | Sager |
| 2005/0126621 A1 | 6/2005 | Dinwoodie et al. |
| 2005/0135724 A1 | 6/2005 | Helvajian et al. |
| 2005/0172996 A1 | 8/2005 | Hacke et al. |
| 2005/0172998 A1 | 8/2005 | Gee et al. |
| 2005/0175856 A1 | 8/2005 | Rogers |
| 2005/0176164 A1 | 8/2005 | Gee et al. |
| 2005/0176270 A1 | 8/2005 | Luch |
| 2005/0183767 A1 | 8/2005 | Yu et al. |
| 2005/0186342 A1 | 8/2005 | Sager et al. |
| 2005/0217719 A1 | 10/2005 | Mahieu et al. |
| 2005/0241692 A1 | 11/2005 | Rubin et al. |
| 2005/0263178 A1 | 12/2005 | Montello et al. |
| 2005/0263179 A1 | 12/2005 | Gaudiana et al. |
| 2005/0263180 A1 | 12/2005 | Montello et al. |
| 2005/0274408 A1 | 12/2005 | Li et al. |
| 2006/0030141 A1 | 2/2006 | Weng et al. |
| 2006/0032752 A1 | 2/2006 | Luch |
| 2006/0060237 A1 | 3/2006 | Leidholm et al. |
| 2006/0107471 A1 | 5/2006 | Spath et al. |
| 2006/0118165 A1 | 6/2006 | Van Roosmalen et al. |
| 2006/0121701 A1 | 6/2006 | Basol |
| 2006/0121748 A1 | 6/2006 | Brieko |
| 2006/0160261 A1 | 7/2006 | Sheats et al. |
| 2006/0180195 A1 | 8/2006 | Luch |
| 2006/0219547 A1 * | 10/2006 | Tuttle ....................... 204/192.12 |
| 2007/0283996 A1 | 12/2007 | Hachtmann et al. |
| 2007/0283997 A1 | 12/2007 | Hachtmann et al. |
| 2008/0011350 A1 | 1/2008 | Luch |

| | | | |
|---|---|---|---|
| 2008/0053519 | A1 | 3/2008 | Pearce et al. |
| 2008/0227236 | A1 | 9/2008 | Luch |
| 2008/0314433 | A1 | 12/2008 | Luch |
| 2009/0107538 | A1 | 4/2009 | Luch |
| 2009/0111206 | A1 | 4/2009 | Luch |
| 2009/0145551 | A1 | 6/2009 | Luch |
| 2009/0169722 | A1 | 7/2009 | Luch |
| 2009/0173374 | A1 | 7/2009 | Luch |
| 2009/0223552 | A1 | 9/2009 | Luch |

FOREIGN PATENT DOCUMENTS

| | | |
|---|---|---|
| DE | 2741954 | 3/1979 |
| EP | 0452588 | 10/1991 |
| EP | 793277 | 9/1997 |
| JP | 60000783 | 1/1985 |
| JP | 62-89369 | 4/1987 |
| JP | 63-249379 | 10/1988 |
| JP | 02051282 | 2/1990 |
| JP | 06-196743 | 7/1994 |
| WO | WO89/04062 | 5/1989 |
| WO | WO93/24960 | 12/1993 |
| WO | WO 02/084708 | 10/2002 |
| WO | WO03/001602 | 1/2003 |
| WO | WO03/001602 A3 | 1/2003 |
| WO | WO03/007386 | 1/2003 |
| WO | WO2004/100244 | 11/2004 |
| WO | WO2005/006402 | 1/2005 |
| WO | WO2005/018007 | 2/2005 |
| WO | WO2005/076959 | 8/2005 |
| WO | WO2005/076960 | 8/2005 |
| WO | WO2005/086633 | 9/2005 |
| WO | WO2006/033858 | 3/2006 |
| WO | WO2006/078985 | 7/2006 |
| WO | WO2006/078985 A3 | 7/2006 |
| WO | WO2007/022221 | 2/2007 |
| WO | WO2007/022221 A3 | 2/2007 |

OTHER PUBLICATIONS

"Global Soalr Process" slides 9,.10, 11,23,24 presented at 29$^{th}$ IEEE PVSC, Polycrystalline Thin-Film Solar Cells—Manufacturing Technology, Part 2, May 18-25, 2002, New Orleans, LA.
A. Duggal et al., "OLEDs for Lighting: new Approaches" in Organic Light-Emitting Materials and Devices VII edited by Sakya H. Katafi, Paul A. Lane, Proceedings of SPIE vol. 5214 pp. 241-247 (SPIE, Bellingham, WA, Feb. 2004).
Miasole Solution from http://www.miasole.com/solution/asp 2003.
A. Schönecker, D.W.K. Eikelboom, P. Manshanden, M.J.A.A. Goris, G.P. Wyers, et al., Ace Designs: The Beauty of Rear Contact Solar Cells, 29$^{th}$ IEEE Photovoltaic Specialists Conference, May 2002.
P.C. De Jong, D.W.K. Eikelboom, R. Kinderman, A.C. Tip, J.H. Bultman, M.H.H. Meuwissen, M.A.C.J. Van Den Nieuwenhof, Single-Step Laminated Full-Size PV Modules Made with Back-Contacted mc-SI Cells and Conductive Adhesives, 19$^{th}$ EPVSEC, Paris, Jun. 2004.
A. Schönecker, D.W.K. Eikelboom, P. Manshanden, M.J.A.A. Goris, G.P. Wyers, et al., Advanced Crystalline Silicon Solar Cell Designs, Final Report of European Commission project, JOR3-CT98-02692, (2001).
A. Schönecker, D.W.K. Eikelboom, P. Manshanden, M.J.A.A. Goris, G.P. Wyers, et al., Ace Designs: The Beauty of Rear Contact Solar Cells, 29$^{th}$ IEEE Photovoltaic Specialists Conference, May 2002 (pre print).
Akahiro Takano, Tomoyoshi Kamoshita, Light-Weight and Large-Area Solar Cell Production Technology, Japanese Journal of Applied Physics, vol. 43, No. 12, 2004, pp. 7976-7983.
K. Tabuchi, S. Fujikake, H. Sato, S. Saito, A. Takano, T. Wada, T. Yoshida, Y. Ichikawa, H. Sakai, F. Natsume, Improvement of Large-Area Scaf Structure A-Si Solar Cells with Plastic Film Substrate, Conference Record of the Twenty-Sixth IEEE Photovoltaic Specialists Conference, Sep. 29-Oct. 3, 1997.
Shinji Fujikake, Masayoshi Uno, Shinji Iwasaki, Yukio Takeda, Takehito Wada, Masayuki Tanda, Akahiro Takano, Takashi Yoshida, Fabrication Technologies for Large-Area Plastic-Film-Substrate Solar Cells, Proceedings of 3rd World Conference on Photovoltaic Energy Conversion, 2003, vol. 2, Issue , May 12-16, 2003 pp. 1760-1763 vol. 2.
J.H. Bultman, D.W.K. Eikelboom, R. Kinderman, A.C. Tip, C.J.J. Tool, et al., Fast and Easy Single Step Module Assembly for Back-Contacted C-Si Solar Cells with Conductive Adhesives, Proceedings of 3rd World Conference on Photovoltaic Energy Conversion, 2003, Publication Date: May 11-18, 2003 vol. 1, On pp. 979-982 vol. 1.
H. Knauss, P. Fath, W. Jooss, M. McCann, E. Ruland, S. Steckemetz, Large Area Metallisation Wrap Through Solar Cells With Thickfilm Metallisation, 20th European Solar Energy Conference and Exhibition, Jun. 6-10, 2005 Barcelona, Spain.
E. Van Kerschaver, C. Allebe, G. Beaucarne, Optimized Adaptive Back Contacted Solar Cells, 19$^{th}$ EPVSEC, Paris, Jun. 2004.
A. R. Burgers, J.A. Eikelboom, Optimizing Metalization Patterns for Yearly Yield, Conference Record of the Twenty-Sixth IEEE Photovoltaic Specialists Conference, Sep. 29-Oct. 3, 1997 pp. 219-222.
A. Schönecker, H.H.C. De Moor, A.R. Burgers, A.W. Weeber, J. Hoornstra, et al., An Industrial Multi-Crystalline EWT Solar Cell With Screen Printed Metallisation, 14th Eur. Photovoltaic Solar Energy Conference and Exhibition, Barcelona, Spain,(1997).
J.H. Bultman, A.W. Weeber, M.W. Brieko, J. Hoonstra, et al., Pin Up Module: A Design for Higher Efficiency, Easy Module Manufacturing and Attractive Appearance, ECN-RX—00-010; May 2000; 4 pag.; Presented at 16th European Photovoltaic Solar Energy Conference and Exhibition, Glasgow, Scotland, May 1-5, 2000.
James M. Gee, Stephan E. Garrett, William P. Morgan, Simplified Module Assembly Using Back-Contact Crystalline-Silicon Solar Cells, Conference Record of the Twenty-Sixth IEEE Photovoltaic Specialists Conference, Sep. 29-Oct. 3, 1997.
A.R. Burgers, J.H. Bultman, A.C. Tip, W.C. Sinke, Metallisation Patterns for Interconnection Through Holes, Solar Energy Materials & Solar Cells 65 (2001) 347-353.
J.H. Bultman, M.W. Brieko, A.R. Burgers, J. Hoornstra, A.C. Tip, A.W. Weeber, Interconnection Through Vias for Improved Efficiency and Easy Module Manufacturing of Crystalline Silicon Solar Cells, Solar Energy Materials & Solar Cells 65 (2001) 339-345.
A.R. Burgers, How to Design Optimal Metallisation Patterns for Solar Cells, Prog. Photovolt: Res. Appl. 7, 457-461 (1999).
Bultman, J.H.; Eikelboom, D.W.K.; Kinderman, R.; Tip, A.C.; Weeber, A.W.; Meuwissen, M.H.H.; Nieuwenhof, M.A.C.J. Van Den; Michiels, P.P.; Schoofs, C.; Schuurmans, F.M., Selecting optimal interconnection methodology for easy and cost efficient Manufacturing of the pin up module ECN-RX—02-051; Oct. 2002; 4 pag.; Presented at PV in Europe—From PV Technology to Energy Solutions Conference and Exhibition, Rome, Italy, Oct. 7-11, 2002.
Eikelboom, D.W.K.; Bultman, J.H.; Schönecker, A.; Meuwissen, M.H.H.; Nieuwenhof, M.A.C.J. Van Den; Meier, D.L., Conductive adhesives for low-stress interconnection of thin back-contact solar cells ECN-RX—02-052; Oct. 2002; 4 pag.; Presented at PV in Europe—From PV Technology to Energy Solutions Conference and Exhibition, Rome, Italy, Oct. 7-11, 2002.
Eikelboom, D.W.K.; Burgers, A.R.; Goris, M.J.A.A.; Manshanden, P.; Schönecker, A.; Wyers, G.P., Conductive adhesives for interconnection of busbarless emitter wrap-through solar cells on a structured metal foil, ECN-RX—01-016; Oct. 2001; 4 pages; Presented at 17th European Photovoltaic Solar Energy Conference, Munich, Germany, Oct. 22-26, 2001.
E. Van Kerschaver, S. De Wolf, C. Allebe, J. Szlufcik, High Performance Modules Based on Back Contacted Solar Cells, 17th Dur. PV Solar Energy Conf., Munich, Germany, Oct. 2001.
Kray, et al, "High-Efficiency Emitter-Wrap-Through Cells", 17.sup.th EU-PVSEC Munich, Oct. 2001.
David D. Smith, James M. Gee, Review of Back Contact Silicon Solar Cells for Low Cost Application, 16$^{th}$ European Photovoltaic Solar Energy Conference, Glasgow, May 2000.
H. Knauss, W. Jooss, S. Roberts, T.M. Bruton, R. Toelle, P. Fath, E. Bucher, Emitter Wrap Through Solar Cells using Electroless Plating Metallisation, 17th European PVSEC, Oct. 2001 Paper VC3-9.
Yukimi Ichikawa, Shinji Fujikake, Katsuya Tabuchi, Toshiaki Sasaki, Toshio Hama, Takashi Yoshida, Hiroshi Sakai, Misao Saga, Flexible A-Si Based Solar Cells with Plastic Film Substrate, Mst. Res. Soc. Symp. Proc. vol. 557. (1999) p. 703-712.

T. Yoshida, S. Fujikake, S. Kato, M. Tanda, K. Tabuchi, A. Takano, Y. Ichikawa, H. Sakai, Development of Process Technologies for Plastic-film Substrate Solar Cells, Solar Energy Materials and Solar Cells 48 (1997) 383-391.

Office Action from Chinese patent application Ser. No. 200680006141.8.

U.S. Appl. No. 11/427,328, filed Jun. 28, 2006 which is Pending claims the benefit of U.S. Appl. No. 11/207,157.

U.S. Appl. No. 11/933,416, filed Oct. 31, 2007 which is Pending claims the benefit of U.S. Appl. No. 11/207,157.

U.S. Appl. No. 11/762,040, filed Jun. 12, 2007 which is Pending claims the benefit of U.S. Appl. No. 11/207,157.

U.S. Appl. No. 11/762,043, filed Jun. 12, 2007 which is Pending claims the benefit of U.S. Appl. No. 11/207,157.

U.S. Appl. No. 11/762,048, filed Jun. 12, 2007 which is Pending claims the benefit of U.S. Appl. No. 11/207,157.

U.S. Appl. No. 11/278,648, filed Apr. 4, 2006 which is Pending claims the benefit of U.S. Appl. No. 11/207,157.

U.S. Appl. No. 11/278,645, filed Apr. 4, 2006 which is Pending claims the benefit of U.S. Appl. No. 11/207,157.

U.S. Appl. No. 12/064,031, filed Feb. 16, 2008 which is Pending claims the benefit of U.S. Appl. No. 11/207,157.

US Office Action from U.S. Appl. No. 11/278,648 dated Mar. 4, 2009.

US Office Action from U.S. Appl. No. 11/278,648 dated Dec. 23, 2009.

US Office Action from U.S. Appl. No. 11/278,645 dated Dec. 30, 2008.

US Office Action from U.S. Appl. No. 11/278,645 dated Aug. 3, 2009.

US Notice of Allowance from U.S. Appl. No. 11/865,691 dated Jun. 12, 2009.

US Office Action from U.S. Appl. No. 11/245,734 dated Sep. 28, 2009.

US Office Action from U.S. Appl. No. 11/039,053 dated Jan. 5, 2007.

US Office Action from U.S. Appl. No. 11/933,416 dated Sep. 14, 2009.

US Office Action from U.S. Appl. No. 11/207,157 dated Sep. 27, 2007.

US Office Action from U.S. Appl. No. 11/207,157 dated Jul. 29, 2008.

US Office Action from U.S. Appl. No. 11/207,157 dated May 13, 2009.

Chinese Office Action from Chinese Application 200580036909.1 Jun. 20, 2008.

Chinese Office Action from Chinese Application 200580036909.1 Feb. 6, 2009.

Chinese Office Action from Chinese Application 200580036909.1 Sep. 25, 2009.

European Office Action from EP application 05 796 064.3 Mar. 10, 2008.

European Office Action from EP application 05 796 064.3 Oct. 19, 2007.

US Office Actions from U.S. Appl. No. 10/943,685.

S. Wiedeman et al. "CIGS Processing on a Flexible Polyimide Substrates" Proc. 2001 NCPV Program Review Meeting, p. 49-50 (2001).

Ki Tae Nam, Arindom Datta, Soo-Hyun Kim, and Ki-Bum Kim, Improved diffusion barrier by stuffing the grain boundaries of TiN with a thin Al interlayer for Cu metallization, Applied Physics Letters, Oct. 15, 2001, 2549-2551, vol. 79, No. 16, American Institute of Physics, New York.

Vijay K. Kapur, Ashish Bansal, Phucan Le, and Omar I. Asensio, Non-vacuum processing of $CuIn_{1-x}Ga_xSe_2$ solar cells on rigid and flexible substrates using nanoparticle precursor inks, Thin Solid Films, 2003, 53-57, vol. 431-432, Elsevier Publishing Company, Amsterdam.

Markus E. Beck, and Michael Cocivera, Thin-film copper indium diselenide prepared by selenization of copper indium oxide formed by spray pyrolysis, Thin Solid Films, 1996, 71-82, vol. 272, Elsevier Publishing Company, Amsterdam.

W. Sinke, G. P. A. Frijlink, and F. W. Saris, Oxygen in titanium nitride diffusion barriers, Applied Physics Letters, Sep. 1, 1985, 471-473, vol. 47, No. 5, American Institute of Physics, New York.

C. Eberspacher, K. Pauls, and J. Serra, Non-vacuum processing of CIGS solar cells, UNISUN, 223-224, 2001, Newbury Park, CA.

T. Arita, N. Suyama, Y. Kita, S. Kitamura, T. Hibino, H. Takada, K. Omura, N. Ueno, and M. Murozono, $CuInSe_2$ films prepared by screen-printing and sintering method, 1988, IEEE.

J.-S. Chun, P. Desjardins, C. Lavoie, C.-S. Shin, C. Cabral, Jr., I. Petrov and J. E. Greene, Interfacial reactions in epitaxial Al/TiN(111) model diffusion barriers: Formation of an impervious self-limited wurtzite-structure AlN(0001) blocking layer, Journal of Applied Physics, Jun. 15, 2001, 7841-7845, vol. 89, No. 12, American Institute of Physics, New York.

Douglas L. Schulz, Calvin J. Curtis, Rebecca A. Flitton, Holm Wiesner, James Keane, Richard J. Matson, Kim M. Jones, Philip A. Parilla, Rommel Noufi, and David S. Ginley, Cu—In—Ga—Se Nanoparticle Colloids as Spray Deposition Precursors for Cu(In, Ga)$Se_2$ Solar Cell Materials, Journal of Electronic Materials, 1998, 433-437, vol. 27, No. 5, Minerals Metals & Materials Society : USA.

Soo-Hyun Kim, Ki Tae Nam, Arindom Datta, and Ki-Bum Kim, Failure mechanism of a multilayer (TiN/Al/TiN) diffusion barrier between copper and silicon, Journal of Applied Physics, Nov. 1, 2002, 5512-5519, vol. 92, No. 9, American Institute of Physics, New York.

Claire J. Carmalt, Daniel E. Morrison, and Ivan P. Parkin, Solid-state and solution phase metathetical synthesis of copper indium chalcogenides, Journal of Materials Chemistry, 1998, 2209-2211, vol. 8, No. 10, Royal Society of Chemistry (Great Britain).

A. Kohlhase, M. Mandl, and W. Pamler, Performance and failure mechanisms of TiN diffusion barrier layers in submicron devices, Journal of Applied Physics, Mar. 15, 1989, 2464-2469, vol. 65, No. 6, American Institute of Physics, New York.

Shixing Weng and Michael Cocivera, Preparation of copper indium diselenide by selenization of copper indium oxide, Journal of Applied Physics, Aug. 1, 1993, 2046-2052, vol. 74, No. 3, American Institute of Physics, New York.

G.. Norsworthy, C.R. Leidholm, A. Halani, V.K. Kapur, R. Roe, B.M. Basol, and R. Matson, CIS film growth by metallic ink coating and selenization, Solar Energy Materials & Solar Cells, 2000, 127-134, vol. 60, Elsevier Science, Amsterdam : Netherlands.

J. O. Olowolafe, Jian Li, J. W. Mayer, and E. G. Colgan, Effects of oxygen in TiNx on the diffusion of Cu in Cu/TiN/Al and Cu/TiNx/Si structures, Applied Physics Letters, Feb. 4, 2001, 469-471, vol. 58, No. 5, American Institute of Physics, New York.

Chris Eberspacher, Chris Fredric, Karen Pauls, and Jack Serra, Thin-filme CIS alloy PV materials fabricated using non-vacuum, particles-based techniques, Thin Solid Films, 2001, 18-22, vol. 387, Elsevier Publishing Company, Amsterdam.

C. Eberspacher, K. L. Pauls, and C. V. Fredric, Improved processes for forming $CuInSe_2$ films, UNISUN, 1-4, Newbury Park, CA.

Hoo-Jeong Lee, Robert Sinclair, Pamela Li, and Bruce Roberts, A study of the failure mechanism of a titanium nitride diffusion barrier, Journal of Applied Physics, Sep. 15, 1999, 3096-3103, vol. 86, No. 6, American Institute of Physics, New York.

Chris Eberspacher, Karen L. Pauls, and John P. Serra, Non-vacuum thin-film CIGS modules, Materials Research Society Symposia Proceedings, 2003, B8.27.1-B8.27.6, vol. 763, Materials Research Society, Warrendale, PA.

M. Mandl, H. Hoffmann, and P. Kucher, Diffusion barrier properties of Ti/TiN investigated by transmission electron microscopy, Journal of Applied Physics, Sep. 1, 1990, 2127-2132, vol. 68, No. 5, American Institute of Physics, New York.

M. Kaelin, D. Rudmann, F. Kurdesau, T. Meyer, H. Zogg, A.N. Tiwari, CIS and CIGS layers from selenized nanoparticle precursors, Thin Solid Films, 2003, 58-62, vol. 431-432, Elsevier Science, Amsterdam : Netherlands.

M. Kaelin, H. Zogg, A.N. Tiwari, O. Wilhelm, S.E. Pratsinis, T. Meyer, and A. Meyer, Electrosprayer and selenized Cu/In metal particle films, Thin Solid Films, 2004, 391-396, vol. 457, Elsevier Science, Amsterdam : Netherlands.

R.P. Raffaelle, J.G. Mantovani, S.G. Bailey, A.F. Hepp, E.M. Gordon and R. Haraway, Electrodeposited $CuInSe_2$ thin film junctions, Prepared for the 1997 Fall meeting sponsored by the Materials Research Society, Dec. 1-5, 1997, Boston, MA.

K.T. Ramakrishna Reddy, R.B.V. Chalapathy, M.A. Slifkin, A.W. Weiss, and R.W. Miles, Photoacousstic spectroscopy of sprayed $CuGa_xIn_{1-x}Se_2$ thin films, Thin Solid Films, 2001, 205-207, vol. 387, Elsevier Science, Amsterdam : Netherlands.

C. Guillen, and J. Herrero, Recrystallization and components redistribution processes in electrodeposited $CuInSe_2$ thin films, Thin Solid Films, 2001, 57-59, vol. 387, Elsevier Science, Amsterdam : Netherlands.

K.T.L. De Silva, W.A.A. Priyantha, J.K.D.S. Jayanetti, B.D. Chithrani, W. Siripala, K. Blake, and I.M. Dharmadasa, Electrodeposition and characterization of $CuInSe_2$ for applications in thin film solar cells, Thin Solid Films, 2001, 158-163, vol. 382, Elsevier Science, Amsterdam : Netherlands.

A. G. Munoz, S. B. Saidman, and J. B. Bessone, Electrodeposition of Indium onto Vitreous Carbon from Acid Chloride Solutions, Journal of the Electrochemical Society, 1999, 2123-2130, vol. 146, No. 6, Electrochemical Society Inc : USA.

D. Padhi, J. Yahalom, S. Gandikota, and G. Dixit, Planarization of Copper Thin Films by Electropolishing in Phosphoric Acid for ULSI Applications, Journal of the Electrochemical Society, 2003, G10-G14, vol. 150, No. 1, Electrochemical Society Inc : USA.

George L. Schnable and John G. Javes, Electrodeposition of Molten Low-Melting Metals and Alloys from Fused-Salt Systems, Electrochemical Technology, Jul.-Aug. 1964, 201-206, Electrochemical Society, Manchester, N.H.

George L. Schnable, Electrodeposition of Molten Metals and Alloys from Glycerine Solutions, Jounal of the Electrochemical Society, Oct. 1961, 964-969, vol. 108, No. 10, Electrochemical Society Inc : USA.

William M. Saltman and Norman H. Nachtrieb, The Electrochemistry of Gallium, Journal of the Electrochemical Society, Mar. 1953, 126-130, vol. 100, No. 3, Electrochemical Society Inc: USA.

Marianna Kemell, Heini Saloniemi, Mikko Ritala, and Markku Leskela, Electrochemical Quartz Crystal Microbalance Study of the Electrodeposition Mechanisms of $CuInSe_2$ Thin Films, Journal of the Electrochemical Society, 2001, C110-C118, vol. 148, No. 2, Electrochemical Society: USA.

L. Gao, J. Gstottner, R. Emling, M. Balden, Ch. Linsmeier, A. Wiltner, W. Hansch, and D. Schmitt-Landsiedel, Thermal stability of titanium nitride diffusion barrier films for advanced silver interconnects, Microelectronic Engineering, Oct. 2004, 76-81, vol. 76, Issue 1-4, Elsevier Science Ltd., Oxford, UK.

A. Kampmann, P. Cowache, D. Lincot, and J. Vedel, Juction Formation Studies of One-Step Electrodeposited $CuInSe_2$ on CdS, Journal of the Electrochemical Society, 1999, 150-155, vol. 146, No. 1, Royal Society of Chemistry (Great Britain).

Arindom Datta, Ki Tae Name, Soo-Hyun Kim, and Ki-Bum Kim, Optimization of Al interlayer thichness for the multilayer diffusion barrier scheme in Cu metallization, Journal of Applied Physics, Jul. 15, 2002, 1099-1105, vol. 92, No. 2, American Institute of Physics, New York.

J. Bonitz, S.E. Schultz, T. Gessner, Ultra Thin CVD TiN Layers as Diffusion Barrier Films on Porous Low-K Mateirals, Microelec. Eng. V76, p. 28, 2004.

J.X. Liao, L.F. Xia, M.R. Sun, W.M. Liu, T.Xu, C.R. Yang, H.W. Chen, C.L. Fu, W.J. Leng, Structural Characteristics of 2024 Aluminum Alloy Plasma-based Ion Implanted with Nitrogen then Titanium, Applied Surface Sciences 240, online Sep. 2, 2004, Elsevier Science Ltd., Oxford, UK.

C. Eberspacher, K. Pauls, and J. Serra, Non-vacuum processing of CIGS solar cells, UNISUN, pp. 1-5, 2003 Newbury Park, CA.

US Office Action from U.S. Appl. No. 11/278,648 dated Aug. 19, 2011.

US Office Action from U.S. Appl. No. 11/762,043 dated Dec. 21, 2010.

US Office Action from U.S. Appl. No. 11/762,043 dated Aug. 4, 2011.

Chinese Office Action from Chinese Application 20060034955.2 Aug. 12, 2010.

Chinese Office Action from Chinese Application 20060034955.2 Aug. 15, 2011.

Chinese Office Action from Chinese Application 200780016606.2 Nov. 21, 2011.

PCT Written Opinion for WO2007106756 dated Sep. 29, 2008.

Office Action from Chinese patent application Ser. No. 200680006141.8 Mar. 30, 2011.

Xue et al., "4.2% efficient organic photovoltaic cells with low series resistances", Appl. Phys. Lett. 84, 3013 (2004).

* cited by examiner

PHOTOVOLTAIC DEVICES WITH CONDUCTIVE BARRIER LAYERS AND FOIL SUBSTRATES

FIELD OF THE INVENTION

The present invention relates to photovoltaic devices and more specifically to fabrication of absorber layers for photovoltaic devices.

BACKGROUND OF THE INVENTION

Efficient photovoltaic devices, such as solar cells, have been fabricated using absorber layers made with alloys containing elements of group IB, IIIA and VIA, e.g., alloys of copper with indium and/or gallium or aluminum and selenium and/or sulfur. One common combination of the aforementioned elements is copper-indium-gallium-diselenide (CIGS) and the resulting devices are often referred to as CIGS solar cells. The CIGS absorber layer may be deposited on a substrate. It would be desirable to fabricate such an absorber layer on an aluminum foil substrate because aluminum foil is relatively inexpensive, lightweight, and flexible. Unfortunately, current techniques for depositing CIGS absorber layers are incompatible with the use of aluminum foil as a substrate.

Typical deposition techniques include evaporation, sputtering, chemical vapor deposition, and the like. These deposition processes are typically carried out at high temperatures and for extended times. Both factors can result in damage to the substrate upon which deposition is occurring. Such damage can arise directly from changes in the substrate material upon exposure to heat, and/or from undesirable chemical reactions driven by the heat of the deposition process. Thus, very robust substrate materials are typically required for fabrication of CIGS solar cells. These limitations have excluded the use of aluminum and aluminum-foil based foils.

An alternative deposition approach is the solution-based printing of the CIGS precursor materials onto a substrate. Examples of solution-based printing techniques are described, e.g., in Published PCT Application WO 2002/084708 and commonly-assigned U.S. patent application Ser. No. 10/782,017, both of which are incorporated herein by reference. Advantages to this deposition approach include both the relatively lower deposition temperature and the rapidity of the deposition process. Both advantages serve to minimize the potential for heat-induced damage of the substrate on which the deposit is being formed.

Although solution deposition is a relatively low temperature step in fabrication of CIGS solar cells, it is not the only step. In addition to the deposition, a key step in the fabrication of CIGS solar cells is the selenization and annealing of the CIGS absorber layer. Selenization introduces selenium into the bulk CIG or CI absorber layer, where the element incorporates into the film, while the annealing provides the absorber layer with the proper crystalline structure. In the prior art, selenization and annealing has been performed by heating the substrate in the presence of $H_2Se$ or Se vapor and keeping this nascent absorber layer at high temperatures for long periods of time.

While use of Al as a substrate for solar cell devices would be desirable due to both the low cost and lightweight nature of such a substrate, conventional techniques that effectively anneal the CIGS absorber layer also heat the substrate to high temperatures, resulting in damage to Al substrates. There are several factors that result in Al substrate degradation upon extended exposure to heat and/or selenium-containing compounds for extended times. First, upon extended heating, the discrete layers within a Mo-coated Al substrate can fuse and form an intermetallic back contact for the device, which decreases the intended electronic functionality of the Mo-layer. Second, the interfacial morphology of the Mo layer is altered during heating, which can negatively affect subsequent CIGS grain growth through changes in the nucleation patterns that arise on the Mo layer surface. Third, upon extended heating, Al can migrate into the CIGS absorber layer, disrupting the function of the semiconductor. Fourth, the impurities that are typically present in the Al foil (e.g. Si, Fe, Mn, Ti, Zn, and V) can travel along with mobile Al that diffuses into the solar cell upon extended heating, which can disrupt both the electronic and optoelectronic function of the cell. Fifth, when Se is exposed to Al for relatively long times and at relatively high temperatures, aluminum selenide can form, which is unstable. In moist air the aluminum selenide can react with water vapor to form aluminum oxide and hydrogen selenide. Hydrogen selenide is a highly toxic gas, whose free formation can pose a safety hazard. For all these reasons, high-temperature deposition, annealing, and selenization are therefore impractical for substrates made of aluminum or aluminum alloys.

Because of the high-temperature, long-duration deposition and annealing steps, CIGS solar cells cannot be effectively fabricated on aluminum substrates (e.g. flexible foils comprised of Al and/or Al-based alloys) and instead must be fabricated on heavier substrates made of more robust (and more expensive) materials, such as stainless steel, titanium, or molybdenum foils, glass substrates, or metal- or metal-oxide coated glass. Thus, even though CIGS solar cells based on aluminum foils would be more lightweight, flexible, and inexpensive than stainless steel, titanium, or molybdenum foils, glass substrates, or metal- or metal-oxide coated glass substrates, current practice does not permit aluminum foil to be used as a substrate.

Thus, there is a need in the art for a method for fabricating solar cells on aluminum substrates.

SUMMARY OF THE INVENTION

Embodiments of the present invention address at least some of the drawbacks set forth above. The present invention provides photovoltaic devices that are cost-effectively manufactured in high-throughput manner on foil substrates. The thin, flexible nature of the photovoltaic devices may also allow them to be rolled or folded into a smaller form factor for ease of transportation but also allow for streamlined fabrication. Embodiments of the present invention may also be designed to reduce the amount raw materials used in the manufacturing process. It also should be understood that embodiments of the present invention may be adapted for use with absorber layers of a variety of materials and are not limited to only CIGS absorber layers. At least some of these and other objectives described herein will be met by various embodiments of the present invention.

In one embodiment of the present invention, a method of manufacturing photovoltaic devices may be comprised of providing a substrate having at least one electrically conductive metal foil substrate, at least one electrically conductive diffusion barrier layer, and at least one electrically conductive electrode layer above the diffusion barrier layer. Although not limited to the following, the foil substrate may be an aluminum foil substrate. The electrically conductive diffusion barrier layer may prevent chemical interaction between the aluminum foil substrate and the electrode layer. The method may include forming an absorber layer on the substrate. In one embodiment, the absorber layer may be a non-silicon absorber layer. In another embodiment, the absorber layer may be an amorphous silicon (doped or undoped) absorber layer. Optionally, the absorber layer may be based on organic and/or inorganic materials.

For any of the embodiments described herein, the following may also apply. The forming step may be comprised of first forming a nascent absorber layer. The nascent absorber layer may be reacted to form a dense film. In some embodiments, the dense film is the absorber layer. In other embodiments, the dense film is process in another step to form the desired absorber layer. The nascent absorber layer may be heated to form a dense film. It should be understood that the diffusion barrier layer inhibits inter-diffusion of aluminum in the foil substrate and metal in the electrode layer during heating. The diffusion barrier layer may include one or more of the following materials: chromium, vanadium, tungsten, glass, and/or nitrides, tantalum nitride, tungsten nitride, titanium nitride, zirconium nitride, hafnium nitride, and silicon nitride, oxides, or carbides. The electrode layer may be comprised of molybdenum. Alternatively, the electrode layer may be comprised of copper, silver, aluminum, and niobium.

In another embodiment of the present invention, a photovoltaic device is provided having a substrate comprising of at least one electrically conductive aluminum foil substrate, at least one electrically conductive diffusion barrier layer, and at least one electrically conductive electrode layer above the diffusion barrier layer, wherein the diffusion barrier layer prevents chemical interaction between the aluminum foil substrate and the electrode layer. The device may include an absorber layer formed on the substrate. In one embodiment, the absorber layer may be a non-silicon absorber layer. Optionally, the absorber layer may be based on organic and/or inorganic materials.

In yet another embodiment of the present invention, a method for forming an absorber layer of a photovoltaic device comprises providing a substrate having at least one electrically conductive metallized polymer foil substrate, at least one electrically conductive diffusion barrier layer, and at least one electrically conductive back electrode layer above the diffusion barrier layer. The diffusion barrier layer prevents chemical interaction between the metallized polymer foil substrate and the back electrode layer. The method may include forming an absorber layer on the substrate. In one embodiment, the absorber layer may be a non-silicon absorber layer. In another embodiment, the absorber layer may be an amorphous silicon (doped or undoped) absorber layer. Optionally, the absorber layer may be based on organic and/or inorganic materials. The foil substrate may contain a polymer selected from the group of: polyesters, polyethylene naphtalates, polyetherimides, polyethersulfones, polyetheretherketones, polyimides, and/or combinations of the above. The metal used for metallization of the polymer foil substrate may be aluminum or an alloy of aluminum with one or more metals.

In a still further embodiment of the present invention, a photovoltaic device is provided comprising of a substrate having at least one electrically conductive aluminum foil substrate, at least one electrically conductive diffusion barrier layer, and at least one electrically conductive back electrode layer above the diffusion barrier layer, wherein the diffusion barrier layer prevents chemical interaction between the aluminum foil substrate and the back electrode layer. The device may include an absorber layer formed on the substrate. In one embodiment, the absorber layer may be a non-silicon absorber layer. In another embodiment, the absorber layer may be an amorphous silicon (doped or undoped) absorber layer. Optionally, the absorber layer may be based on inorganic and/or organic materials.

For any of the embodiments described herein, the following may also apply. The absorber layer may include one or more inorganic materials selected from the following: titania (TiO2), nanocrystalline TiO2, zinc oxide (ZnO), copper oxide (CuO or Cu2O or CuxOy), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium sulfide (CdS), copper sulfide (Cu2S), cadmium telluride (CdTe), cadmium-tellurium selenide (CdTeSe), copper-indium selenide (CuInSe2), cadmium oxide (CdOx), CuI, CuSCN, a semiconductive material, a group IB element, a group IIIA element, a group VIA element, or any combination of the above.

Optionally, any of the photovoltaic devices disclosed in the present application may include an organic material in the absorber layer. The absorber layer may include one or more organic materials from the following: a conjugated polymer, poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly (para-phenylene vinylene), (PPV)), PPV copolymers, poly (thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly (thienylenevinylene) and derivatives thereof, and poly (isothianaphthene) and derivatives thereof, 2,2'7,7'tetrakis(N, N-di-p-methoxyphenyl-amine)-9,9'-spirobifluorene(spiro-Me OTAD), organometallic polymers, polymers containing perylene units, poly(squaraines) and their derivatives, and discotic liquid crystals, organic pigments or dyes, ruthenium-based dye, liquid iodide/triiodide electrolyte, azo-dyes having azo chromofores (—N═N—) linking aromatic groups, phthalocyanines including metal-free phthalocyanine; (HPc), perylenes, perylene derivatives, Copper phthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2, 1,9-def:6,5,10-d'e'f']diisoquinoline-1,3,8,10-tetrone, and 2,9-Bis-(1-hexyl-hept-1-yl)-anthra[2,1,9-def:6,5,10-d'e'f'] diisoquinoline-1,3,8,10-tetrone and pentacene, pentacene derivatives and/or pentacene precursors, an N-type ladder polymer such as poly(benzimidazobenzophenanthroline ladder) (BBL), or any combination of the above.

For any of the embodiments described herein, the following may also apply. The absorber layer may include one or more materials from the group consisting of: an oligimeric material, micro-crystalline silicon, inorganic nanorods dispersed in an organic matrix, inorganic tetrapods dispersed in an organic matrix, quantum dot materials, ionic conducting polymer gels, sol-gel nanocomposites containing an ionic liquid, ionic conductors, low molecular weight organic hole conductors, C60 and/or other small molecules, or combinations of the above. The absorber layer may be comprised of one or more of the following: a nanostructured layer having an inorganic porous template with pores filled by an organic material (doped or undoped), a polymer/blend cell architecture, a micro-crystalline silicon cell architecture, or combinations of the above.

Optionally, a photovoltaic device module may use any of the photovoltaic devices disclosed in the present application in a high efficiency cell configuration described below. The photovoltaic device module may include the photovoltaic device, an insulator layer, and a conductive back plane, wherein the insulator layer is sandwiched between the substrate and the back plane. A transparent conducting layer may be disposed such that the absorber layer is between the substrate and the transparent conducting layer. One or more electrical contacts may be positioned between the transparent conducting layer and the back plane to define a conductive pathway, wherein the electrical contacts are formed through the transparent conducting layer, the absorber layer, the substrate, and the insulating layer. The electrical contacts may be electrically isolated from the absorber layer, the substrate, and the insulating layer. The coupling of the electrical contacts to the back plane allows the back plane to carry electric current. Since the back plane carries electric current from one device module to the next, the pattern of traces on the top side of the device need not contain thick busses, as used in the prior art for this purpose. Instead, the pattern of traces need only provide sufficiently conductive "fingers" to carry current to the electrical contacts. In the absence of busses, a greater portion of the absorber layer is exposed, which enhances efficiency. In addition, a pattern of traces without busses can be more aesthetically pleasing.

In another embodiment of the present invention, an optoelectronic device module, comprises of a starting substrate having a bottom electrode made of a flexible bulk conductor, an insulator layer and a conductive back plane, wherein the insulator layer is sandwiched between the bottom electrode and the back plane. The module may also include an active layer and a transparent conducting layer disposed such that the active layer is between the bottom electrode and the transparent conducting layer. The module may also include one or more electrical contacts between the transparent conducting layer and the back plane, the electrical contracts being formed through the transparent conducting layer, the active layer, the flexible bulk conductor and the insulating layer, wherein the electrical contacts are electrically isolated from the active layer, the bottom electrode and the insulating layer.

For any of the embodiments herein, the following may apply. The flexible bulk conductor may be a first metal foil. The first metal foil may be an aluminum foil. The first metal foil may be between about 1 micron thick and about 200 microns thick. The first metal foil may be between about 25 microns thick and about 50 microns thick. The back plane may be a conductive grid. The insulating layer may be an anodized surface of the first metal foil. The back plane may be a second metal foil. The insulating layer may be laminated between the first and second metal foils. The insulating layer may be made of plastic foil. The plastic foil may be between about 1 micron thick and about 200 microns thick. The plastic foil may be between about 10 microns thick and about 50 microns thick. The second metal foil may be between about 1 micron thick and about 200 microns thick. The second metal foil may be between about 25 microns thick and about 50 microns thick. The insulating layer may be an anodized surface of the first and or second metal foil. The one or more electrical contacts between the transparent conducting layer and the back plane may include: a via formed through the transparent conducting layer, the active layer, the flexible bulk conductor and the insulating layer of the first device module; an insulating material coating sidewalls of the via such that a channel is formed through the transparent conducting layer, the active layer, the flexible bulk conductor and the insulating layer to the back plane; and a plug made of an electrically conductive material that at least substantially fills the channel and makes electrical contact between the transparent conducting layer and the back plane. The via may be between about 0.1 millimeters in diameter and about 1.5 millimeters in diameter. The via may be between about 0.5 millimeters in diameter and about 1 millimeter in diameter. The insulating material may be between about 1 micron thick and about 200 microns thick along the via sidewall. The insulating material may be between about 10 microns thick and about 100 microns thick along the via sidewall. The plug may be between about 5 microns in diameter and about 500 microns in diameter. The plug may be between about 25 microns in diameter and about 100 microns in diameter. A pitch between adjacent vias may be between about 0.2 centimeters and about 2 centimeters.

Optionally for any of the embodiments herein, the following may also apply. One or more conductive traces may be disposed on the transparent conducting layer in electrical contact with the plug. The one or more conductive traces may electrically connect two or more of the electrical contacts that are adjacent to each other. The conductive traces may form a pattern in which traces radiate outward from one or more of the electrical contacts. The conductive traces may branch out to form a "watershed" pattern. The one or more of the electrical contacts may include a closed-loop trench that surrounds a portion of the transparent conducting layer, active layer, and a bottom electrode. One or more of the electrical contacts may further include an insulating material disposed in the closed-loop trench. One or more of the electrical contacts includes a closed loop trench formed though the transparent conducting layer, active layer and bottom electrode of the first device module to the insulating layer, the trench isolating a portion of the transparent conducting layer, active layer and bottom electrode, the isolated portion bounded by the trench; an electrically insulating material disposed in the closed loop trench; an electrical connection between the transparent conducting layer of the isolated portion and the bottom electrode of the isolated portion; one or more conductive fingers disposed over one or more portions of the transparent conducting layer, wherein the one or more portions include the isolated portion; and making electrical contact between the conductive fingers and the bottom electrode of the isolated portion; and an electrical connection through the insulating layer between the bottom electrode of the isolated portion and the back plane. An isolation trench may be formed through the transparent conducting layer and the active layer to the bottom electrode, wherein the isolation trench surrounds the closed-loop trench. An insulating carrier substrate may be used, wherein the backplane is attached to the carrier substrate. A structural membrane may be included that is made of a polymeric roofing membrane material, wherein the carrier substrate is attached to the structural membrane. The polymeric roofing membrane material may be thermoplastic polyolefin (TPO) or ethylene propylene diene monomer (EPDM). The active layer may be a photovoltaic active layer. The photovoltaic active layer may be based on one or more of the following: an absorber layer based on materials containing elements of groups IB, IIIA and VIA, silicon (doped or undoped), micro- or poly-crystalline silicon (doped or undoped), amorphous silicon (doped or undoped), CdTe, CdSe, Graetzel cell architecture, a nanostructured layer having an inorganic porous template with pores filled by an organic material (doped or undoped), a polymer/blend cell architecture, oligimeric absorbers, organic dyes, C60 and/or other small molecules, micro-crystalline silicon cell architecture, randomly placed nanorods and/or tetrapods of inorganic materials dispersed in an organic matrix, quantum dot-based cells, or combinations of the above. The active layer may be a light emitting device active layer. The light emitting device active layer may be an organic light emitting diode active layer. The organic light emitting diode active layer is a light-emitting polymer based active layer. The device module is between about 1 centimeter and about 30 centimeters in length and between about 1 centimeter and about 30 centimeters in width.

In another embodiment of the present invention, an array of series interconnected optoelectronic device modules may be comprised of a first device module and a second device module, wherein each device module includes a starting substrate having a bottom electrode made of a flexible bulk conductor, an insulator layer and a conductive back plane, wherein the insulator layer is sandwiched between the bottom electrode and the back plane; an active layer and a transparent conducting layer disposed such that the active layer is between the bottom electrode and the transparent conducting layer; and one or more electrical contacts between the transparent conducting layer and the back plane, the electrical contracts being formed through the transparent conducting layer, the active layer, the flexible bulk conductor and the insulating layer, wherein the electrical contacts are electrically isolated from the active layer, the bottom electrode and the insulating layer.

In a still further embodiment of the present invention, a method is provided for fabricating an optoelectronic device module. The method comprises of forming a starting substrate having a bottom electrode made of a flexible bulk conductor, an insulator layer and a conductive back plane, wherein the insulator layer is sandwiched between the bottom electrode and the back plane; forming an active layer and a transparent conducting layer such that the active layer is between the bottom electrode and the transparent conducting layer; forming one or more electrical contacts between the transparent conducting layer and the back plane through the transparent conducting layer, the active layer, the flexible bulk conductor and the insulating layer, and electrically isolating the electrical contacts from the active layer, the bottom electrode and the insulating layer.

For any of the embodiments herein, the following may also apply. Forming a starting substrate may include laminating a plastic foil between first and second metal foils. At least one of the first and second metal foils may be an aluminum foil. Two or more device modules may be formed as set forth above. The step of testing the two or more device modules for one or more performance characteristics and using one or more of the device modules that meet acceptance criteria for the one or more performance characteristics in an array of two or more device modules.

A further understanding of the nature and advantages of the invention will become apparent by reference to the remaining portions of the specification and drawings.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention allow fabrication of CIGS absorber layers on aluminum foil substrates. According to embodiments of the present invention, a nascent absorber layer containing elements of group IB and IIIA formed on an aluminum substrate by solution deposition may be annealed by rapid heating from an ambient temperature to a plateau temperature range of between about 200° C. and about 600° C. The temperature is maintained in the plateau range for between about 2 minutes and about 30 minutes, and subsequently reduced. Alternatively, the annealing temperature could be modulated to oscillate within a temperature range without being maintained at a particular plateau temperature.

Figure 1:
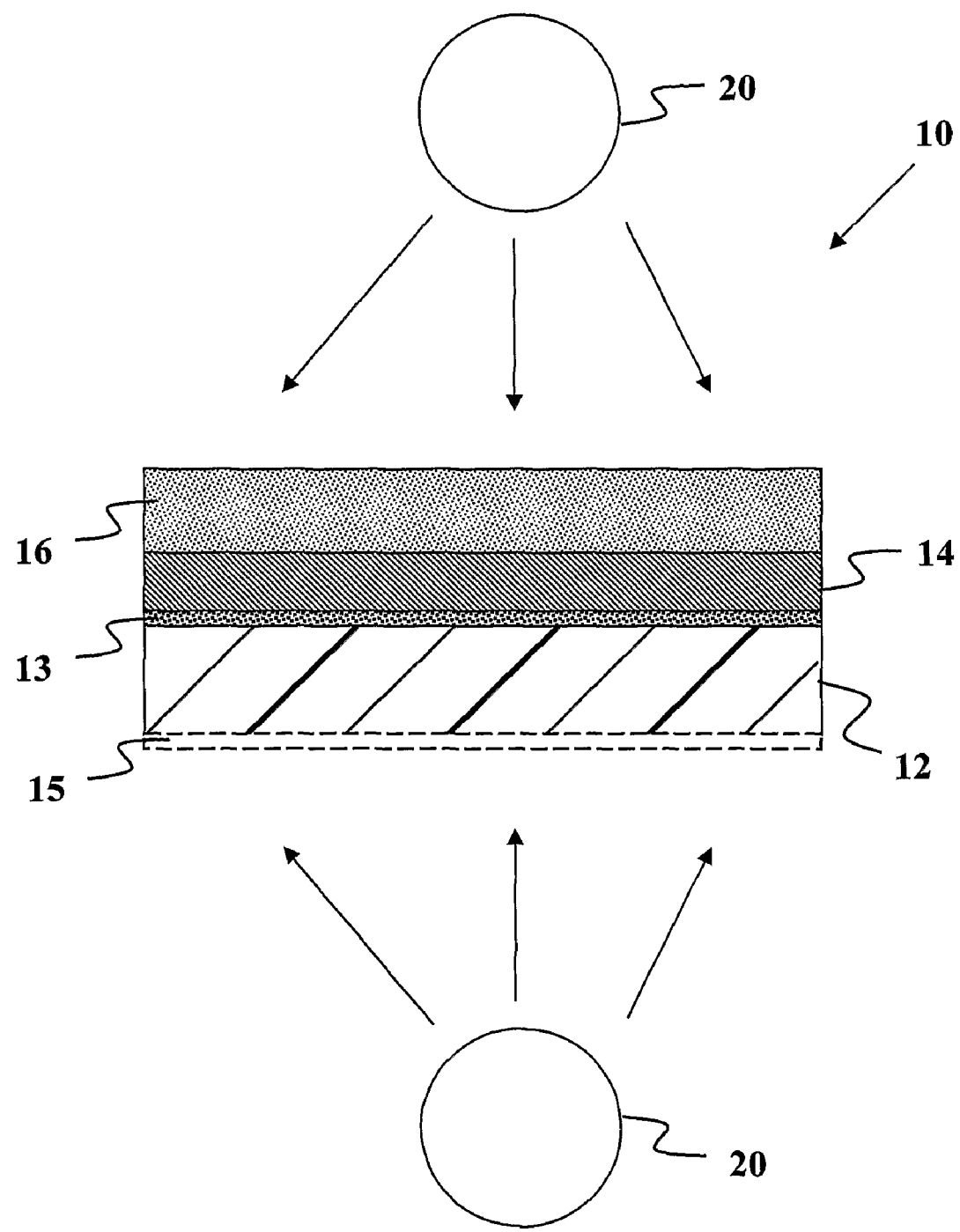
FIG. 1 is a cross-sectional schematic diagram illustrating fabrication of an absorber layer according to an embodiment of the present invention.

FIG. 1 depicts a partially fabricated photovoltaic device 10, and a rapid heating unit 20 the device generally includes an aluminum foil substrate 12, an optional base electrode 14, and a nascent absorber layer 16. The aluminum foil substrate 12 may be approximately 5 microns to one hundred or more microns thick and of any suitable width and length. The aluminum foil substrate 12 may be made of aluminum or an aluminum-based alloy. Alternatively, the aluminum foil substrate 12 may be made by metallizing a polymer foil substrate, where the polymer is selected from the group of polyesters, polyethylene naphtalates, polyetherimides, polyethersulfones, polyetheretherketones, polyimides, and/or combinations of the above. By way of example, the substrate 12 may be in the form of a long sheet of aluminum foil suitable for processing in a roll-to-roll system. The base electrode 14 is made of an electrically conducive material compatible with processing of the nascent absorber layer 16. By way of example, the base electrode 14 may be a layer of molybdenum, e.g., about 0.1 to 25 microns thick, and more preferably from about 0.1 to 5 microns thick. The base electrode layer may be deposited by sputtering or evaporation or, alternatively, by chemical vapor deposition (CVD), atomic layer deposition (ALD), sol-gel coating, electroplating and the like. The layer of material such as molybdenum or other material may be applied on one and/or both sides of the aluminum foil substrate.

Aluminum and molybdenum can and often do inter-diffuse into one another, with deleterious electronic and/or optoelectronic effects on the device 10. To inhibit such inter-diffusion, an intermediate, interfacial layer 13 may be incorporated between the aluminum foil substrate 12 and molybdenum base electrode 14. The interfacial layer may be composed of any of a variety of materials, including but not limited to chromium, vanadium, tungsten, and glass, or compounds such as nitrides (including tantalum nitride, tungsten nitride, titanium nitride, and silicon nitride), oxides, and/or carbides. Optionally, the materials selected for the diffusion barrier layer may be electrically conductive. The thickness of this layer can range from 10 nm to 50 nm, and more preferably from 10 m to 30 nm. Optionally, the interfacial layer 13 may be between a base electrode 14 on the topside of the foil substrate and/or between a layer on the bottom side of the foil substrate. Optionally, another layer 15 of material similar to that of layer 13 may also be applied to a backside of aluminum foil substrate 12. The material may be the same as that of layer 13 or it may be another material selected from the set of material listed for layer 13. The layer 15 may provide protective qualities to the back side of substrate 12.

The nascent absorber layer 16 may include material containing elements of groups IB, IIIA, and (optionally) VIA. Preferably, the absorber layer copper (Cu) is the group IB element, Gallium (Ga) and/or Indium (In) and/or Aluminum may be the group IIIA elements and Selenium (Se) and/or Sulfur (S) as group VIA elements. The group VIA element may be incorporated into the nascent absorber layer 16 when it is initially solution deposited or during subsequent processing to form a final absorber layer from the nascent absorber layer 16. The nascent absorber layer 16 may be about 1000 nm thick when deposited. Subsequent rapid thermal processing and incorporation of group VIA elements may change the morphology of the resulting absorber layer such that it increases in thickness (e.g., to about twice as much as the nascent layer thickness under some circumstances).

Fabrication of the absorber layer on the aluminum foil substrate 12 is relatively straightforward. First, the nascent absorber layer is deposited on the substrate 12 either directly on the aluminum or on an uppermost layer such as the electrode 14. By way of example, and without loss of generality, the nascent absorber layer may be deposited in the form of a film of a solution-based precursor material containing nanoparticles that include one or more elements of groups IB, IIIA and (optionally) VIA. Examples of such films of such solution-based printing techniques are described e.g., in commonly-assigned U.S. patent application Ser. No. 10/782,017, entitled "SOLUTION-BASED FABRICATION OF PHOTOVOLTAIC CELL" and also in PCT Publication WO 02/084708, entitled "METHOD OF FORMING SEMICONDUCTOR COMPOUND FILM FOR FABRICATION OF ELECTRONIC DEVICE AND FILM PRODUCED BY SAME" the disclosures of both of which are incorporated herein by reference.

Alternatively, the nascent absorber layer 16 may be formed by a sequence of atomic layer deposition reactions or any other conventional process normally used for forming such layers. Atomic layer deposition of IB-IIIA-VIA absorber layers is described, e.g., in commonly-assigned, co-pending application Ser. No. 10/943,685, entitled "FORMATION OF CIGS ABSORBER LAYER MATERIALS USING ATOMIC LAYER DEPOSITION AND HIGH THROUGHPUT SURFACE TREATMENT ON COILED FLEXIBLE SUBSTRATES", which has been incorporated herein by reference above.

The nascent absorber layer 16 is then annealed by flash heating it and/or the substrate 12 from an ambient temperature to an average plateau temperature range of between about 200° C. and about 600° C. with the heating unit 20. The heating unit 20 preferably provides sufficient heat to rapidly raise the temperature of the nascent absorber layer 16 and/or substrate 12 (or a significant portion thereof) e.g., at between about 5 C. °/sec and about 150 C. °/sec. By way of example, the heating unit 20 may include one or more infrared (IR) lamps that provide sufficient radiant heat. By way of example, 8 IR lamps rated at about 500 watts each situated about ⅛" to about 1" from the surface of the substrate 12 (4 above and 4 below the substrate, all aimed towards the substrate) can provide sufficient radiant heat to process a substrate area of about 25 $cm^2$ per hour in a 4" tube furnace. The lamps may be ramped up in a controlled fashion, e.g., at an average ramp rate of about 10 C. °/sec. Those of skill in the art will be able to devise other types and configurations of heat sources that may be used as the heating unit 20. For example, in a roll-to-roll manufacturing line, heating and other processing can be carried out by use of IR lamps spaced 1" apart along the length of the processing region, with IR lamps equally positioned both above and below the substrate, and where both the IR lamps above and below the substrate are aimed towards the substrate. Alternatively, IR lamps could be placed either only above or only below the substrate 12, and/or in configurations that augment lateral heating from the side of the chamber to the side of the substrate 12.

The absorber layer 16 and/or substrate 12 are maintained in the average plateau temperature range for between about 2 minutes and about 30 minutes. For example, the temperature may be maintained in the desired range by reducing the amount of heat from the heating unit 20 to a suitable level. In the example of IR lamps, the heat may be reduced by simply turning off the lamps. Alternatively, the lamps may be actively cooled. The temperature of the absorber layer 16 and/or substrate 12 is subsequently reduced to a suitable level, e.g., by further reducing or shutting off the supply of heat from the heating unit 20.

In some embodiments of the invention, group VIA elements such as selenium or sulfur may be incorporated into the absorber layer either before or during the annealing stage. Alternatively, two or more discrete or continuous annealing stages can be sequentially carried out, in which group VIA elements such as selenium or sulfur are incorporated in a second or latter stage. For example, the nascent absorber layer 16 may be exposed to $H_2Se$ gas, $H_2S$ gas or Se vapor before or during flash heating or rapid thermal processing (RTP). In this embodiment, the relative brevity of exposure allows the aluminum substrate to better withstand the presence of these gases and vapors, especially at high heat levels.

Once the nascent absorber layer 16 has been annealed additional layers may be formed to complete the device 10. For example a window layer is typically used as a junction partner for the absorber layer. By way of example, the junction partner layer may include cadmium sulfide (CdS), zinc sulfide (ZnS), or zinc selenide (ZnSe) or some combination of two or more of these. Layers of these materials may be deposited, e.g., by chemical bath deposition, chemical surface deposition, or spray pyrolysis, to a thickness of about 50 nm to about 100 nm. In addition, a transparent electrode, e.g., a conductive oxide layer, may be formed on the window layer by sputtering, vapor deposition, CVD, ALD, electrochemical atomic layer epitaxy and the like.

Embodiments of the present invention overcome the disadvantages associated with the prior art by rapid thermal processing of nascent CIGS absorber layers deposited or otherwise formed on aluminum substrates. Aluminum substrates are much cheaper and more lightweight than conventional substrates. Thus, solar cells based on aluminum substrates can have a lower cost per watt for electricity generated and a far shorter energy payback period when compared to conventional silicon-based solar cells. Furthermore aluminum substrates allow for a flexible form factor that permits both high-throughput roll-to-roll printing during solar cell fabrication and faster and easier installation processes during solar module and system installation.

Embodiments of the present invention allow the fabrication of lightweight and inexpensive photovoltaic devices on aluminum substrates. Flash heating/rapid thermal processing of the nascent absorber layer 16 allows for proper annealing and incorporation of group VIA elements without damaging or destroying the aluminum foil substrate 12. The plateau temperature range is sufficiently below the melting point of aluminum (about 660° C.) to avoid damaging or destroying the aluminum foil substrate. The use of aluminum foil substrates can greatly reduce the materials cost of photovoltaic devices, e.g., solar cells, made on such substrates thereby reducing the cost per watt. Economies of scale may be achieved by processing the aluminum foil substrate in a roll-to-roll fashion, with the various layers of the photovoltaic devices being built up on the substrate as it passes through a series of deposition annealing and other processing stages.

Although CIGS solar cells are described for the purposes of example, those of skill in the art will recognize that embodiments of the present invention can be applied to almost any type of solar cell architecture. For example, the layer 16 may be an absorber layer comprised of organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, and/or combinations of the above, where the active materials are present in any of several forms including but not limited to bulk materials, microparticles, nano-particles, or quantum dots. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Many of these types of cells can be fabricated on flexible substrates.

It should be understood that the P-type layer may be either organic or inorganic. Alternatively, the N-type layer may be either organic or inorganic. The possible combinations may result in an inorganic P-type layer with an inorganic N-type layer, an inorganic P-type layer with an organic N-type layer, an organic P-type layer with an inorganic N-type layer, or an organic P-type layer with and organic N-type layer.

By way of nonlimiting example, suitable inorganic materials for the P-type and/or N-type layer include metal oxides such as titania ($TiO_2$), zinc oxide (ZnO), copper oxide (CuO or $Cu_2O$ or $Cu_xO_y$), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium suflide (CdS), copper sulfide (e.g., $Cu_2S$), cadmium telluride (CdTe), cadmium-tellurium selenide (CdTeSe), copper-indium selenide ($CuInSe_2$), cadmium oxide ($CdO_x$) i.e. generally semiconductive materials, as well as blends or alloys of two or more such materials.

By way of nonlimiting example, suitable organic materials for the P-type and/or N-type layer include conjugated polymers such as poly(phenylene) and derivatives thereof, poly (phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof. Other suitable polymers include organometallic polymers, polymers containing perylene units, poly (squaraines) and their derivatives, and discotic liquid crystals. Other suitable organic materials include organic pigments or dyes, azo-dyes having azo chromofores (—N=N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,1,3,8,10-tetrone, and 2,9-Bis-(1-hexyl-hept-1-yl)-anthra[2,1,9-def:6,5,10-d'e'f']diisoquinoline-1,3,8,10-tetrone and pentacene, pentacene derivatives and/or pentacene precursors, an N-type ladder polymer such as poly(benzimidazobenzophenanthroline ladder) (BBL), or any combination of the above.

One organic solar cell suitable for use with the present invention is a Graetzel cell which is comprised of a dye-sensitized, nanocrystalline $TiO_2$ based solar cell using a liquid electrolyte (O'Regan et al. "A Low-cost, High-efficiency solar cell based on dye-sensitized colloidal TiO2 Films", Nature, Vol. 353 pp 737-740, 24 Oct. 1991, fully incorporated herein for all purposes). Dye-sensitized solar cells (DSSC) disaggregate the processes of light absorption and charge separation. A monolayer of a Ruthenium-based dye that is chemically adsorbed onto a semiconductor surface absorbs light. After having been excited by a photon, the dye injects an electron into a nano-particulate past composed of a semiconductor, $TiO_2$ (titania), upon which the electric field inside the titania allows extraction of the electron. In a parallel process, positive charge is transferred from the dye to a liquid iodide/triiodide-based redox mediator, which allows hole transfer through the solution to a counter electrode, after which the redox mediator is returned to its reduced state, closing the circuit.

In alternative embodiments, the liquid iodide/triiodide electrolyte may be replaced with a solid-state material that exhibits sufficient hole transport for efficient device function. These approaches include: (1) Application of ionic conducting polymer gels (Wang et al., 2003), (2) sol-gel nanocomposites containing an ionic liquid (Stathatos et al., 2003), (3) ionic conductors (Cao et al., 1995), (4) inorganic p-type semiconductors, such as CuI or CuSCN (Tennakone et al., 1995; O'Regan and Schwartz, 1998; O'Regan et al., 2003), and (5) low molecular weight organic hole conductors such as 2,2'7,7'tetrakis(N,N-di-p-methoxyphenyl-amine)-9,9'-spirobifluorene(spiro-Me OTAD) (Krüger et al., 2001).

High Efficiency Cell Configuration

Figure 2A:
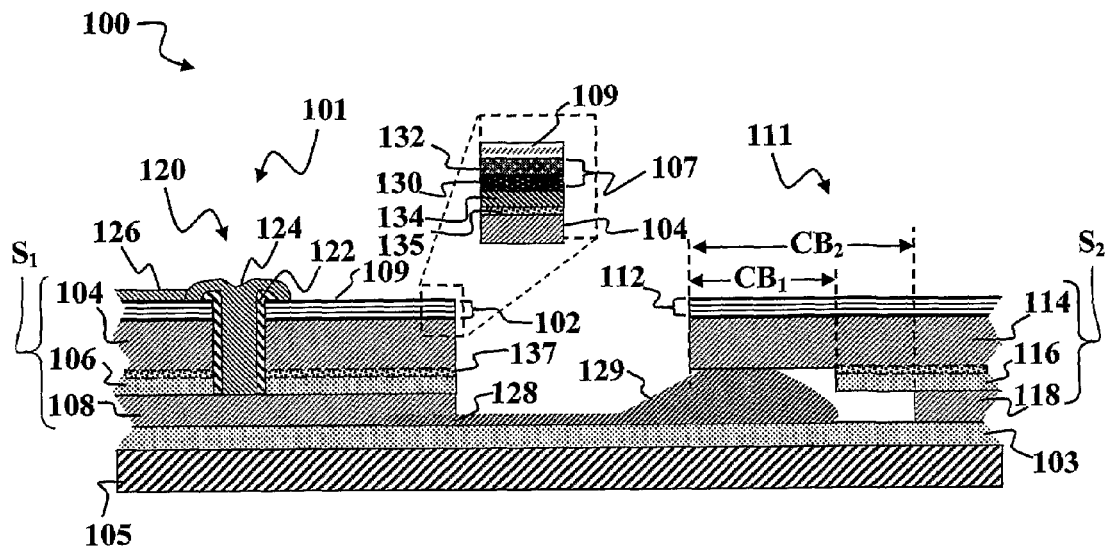
FIG. 2A is a vertical cross-sectional schematic diagram of a portion of an array of optoelectronic devices according to an embodiment of the present invention.

It should be understood that the device manufactured as shown in FIG. 1 and the above paragraphs may be suitable for use in a high efficiency cell configuration as detailed below in FIG. 2A. FIG. 2A illustrates an array 100 of optoelectronic devices according to an embodiment of the present invention. In some embodiments, this may be considered a series interconnection in an array 100 of optoelectronic devices. The array 100 includes a first device module 101 and a second device module 111. The device modules 101, 111 may be photovoltaic devices, such as solar cells, or light-emitting devices, such as light-emitting diodes. In a preferred embodiment, the device modules 101, 111 are solar cells. The first and second device modules 101, 111 are attached to an insulating carrier substrate 103, which may be made of a plastic material such as polyethylene terephthalate (PET), e.g., about 50 microns thick. The carrier substrate 103 may, in turn, be attached to a thicker structural membrane 105, e.g., made of a polymeric roofing membrane material such as thermoplastic polyolefin (TPO) or ethylene propylene diene monomer (EPDM), to facilitate installing the array 100 on an outdoor location such as a roof.

By way of nonlimiting example, the device modules 101, 111, which may be about 4 inches in length and 12 inches wide, may be cut from a much longer sheet containing several layers that are laminated together. Each device module 101, 111 generally includes a device layer 102, 112 in contact with a bottom electrode 104, 114 and an insulating layer 106, 116 between the bottom electrode 104, 114 and a conductive back plane 108, 118. It should be understood that in some embodiments of the present invention, the back plane 108, 118 may be described as a backside top electrode 108, 118. The bottom electrodes 104, 114, insulating layers 106, 116 and back planes 108, 118 for substrates $S_1$, $S_2$ support the device layers 102, 112

In contrast to prior art cells, where the substrates are formed by depositing thin metal layers on an insulating substrate, embodiments of the present invention utilize substrates $S_1$, $S_2$ based on flexible bulk conducting materials, such as foils. Although bulk materials such as foils are thicker than prior art vacuum deposited metal layers they can also be cheaper, more readily available and easier to work with. Preferably, at least the bottom electrode 104, 114 is made of a metal foil, such as aluminum foil. Alternatively, copper, stainless steel, titanium, molybdenum or other suitable metal foils may be used. By way of example, the bottom electrodes 104, 114 and back planes 108, 118 may be made of aluminum foil about 1 micron to about 200 microns thick, preferably about 25 microns to about 100 microns thick; the insulating layers 106, 116 may be made of a plastic foil material, such as polyethylene terephthalate (PET) about 1 micron to about 200 microns thick, preferably about 10 microns to about 50 microns thick. In one embodiment, among others, the bottom electrode 104,114, insulating layer 106, 116 and back plane 108, 118 are laminated together to form the starting substrates $S_1$, $S_2$. Although foils may be used for both the bottom electrode 104, 114 and the back plane 108, 118 it is also possible to use a mesh grid on the back of the insulating layer 106, 116 as a back plane. Such a grid may be printed onto the back of the insulating layer 106, 116 using a conductive ink or paint. One example, among others, of a suitable conductive paint or ink is Dow Corning® PI-2000 Highly Conductive Silver Ink available from Dow Corning Corporation of Midland Mich. Dow Corning® is a registered trademark of Dow Corning Corporation of Midland Mich. Furthermore, the insulating layer 106, 116 may be formed by anodizing a surface of a foil used for the bottom electrode 104, 114 or back plane 108, 118 or both, or by applying an insulating coating by spraying, coating, or printing techniques known in the art.

The device layers 102, 112 generally include an active layer 107 disposed between a transparent conductive layer 109 and the bottom electrode 104. By way of example, the device layers 102, 112 may be about 2 microns thick. At least the first device 101 includes one or more electrical contacts 120 between the transparent conducting layer 109 and the back plane 108. The electrical contacts 120 are formed through the transparent conducting layer 109, the active layer 107, the bottom electrode 104 and the insulating layer 106. The electrical contacts 120 provide an electrically conductive path between the transparent conducting layer 109 and the back plane 108. The electrical contacts 120 are electrically isolated from the active layer 107, the bottom electrode 104 and the insulating layer 106.

The contacts 120 may each include a via formed through the active layer 107, the transparent conducting layer 109, the bottom electrode 104 and the insulating layer 106. Each via may be about 0.1 millimeters to about 1.5 millimeters, preferably 0.5 millimeters to about 1 millimeter in diameter. The vias may be formed by punching or by drilling, for example by mechanical, laser or electron beam drilling, or by a combination of these techniques. An insulating material 122 coats sidewalls of the via such that a channel is formed through the insulating material 122 to the back plane 108. The insulating material 122 may have a thickness between about 1 micron and about 200 microns, preferably between about 10 microns and about 200 microns.

The insulating material 122 should preferably be at least 10 microns thick to ensure complete coverage of the exposed conductive surfaces behind it. The insulating material 122 may be formed by a variety of printing techniques, including for example inkjet printing or dispensing through an annular nozzle. A plug 124 made of an electrically conductive material at least partially fills the channel and makes electrical contact between the transparent conducting layer 109 and the back plane 108. The electrically conductive material may similarly be printed. A suitable material and method, for example, is inkjet printing of solder (called "solderjet" by Microfab, Inc., Plano, Tex., which sells equipment useful for this purpose). Printing of conductive adhesive materials known in the art for electronics packaging may also be used, provided time is allowed subsequently for solvent removal and curing. The plug 124 may have a diameter between about 5 microns and about 500 microns, preferably between about 25 and about 100 microns.

By way of nonlimiting example, in other embodiments, the device layers 102, 112 may be about 2 microns thick, the bottom electrodes 104, 114 may be made of aluminum foil about 100 microns thick; the insulating layers 106, 116 may be made of a plastic material, such as polyethylene terephthalate (PET) about 25 microns thick; and the backside top electrodes 108, 118 may be made of aluminum foil about 25 microns thick. The device layers 102, 112 may include an active layer 107 disposed between a transparent conductive layer 109 and the bottom electrode 104. In such an embodiment, at least the first device 101 includes one or more electrical contacts 120 between the transparent conducting layer 109 and the backside top electrode 108. The electrical contacts 120 are formed through the transparent conducting layer 109, the active layer 107, the bottom electrode 104 and the insulating layer 106. The electrical contacts 120 provide an electrically conductive path between the transparent conducting layer 109 and the backside top electrode 108. The electrical contacts 120 are electrically isolated from the active layer 107, the bottom electrode 104 and the insulating layer 106.

The formation of good contacts between the conductive plug 124 and the substrate 108 may be assisted by the use of other interface-forming techniques such as ultrasonic welding. An example of a useful technique is the formation of gold stud-bumps, as described for example by J. Jay Wimer in "3-D Chip Scale with Lead-Free Processes" in Semiconductor International, Oct. 1, 2003, which is incorporated herein by reference. Ordinary solders or conductive inks or adhesives may be printed on top of the stud bump.

In forming the vias, it is important to avoid making shorting connections between the top electrode 109 and the bottom electrode 104. Therefore, mechanical cutting techniques such as drilling or punching may be advantageously supplemented by laser ablative removal of a small volume of material near the lip of the via, a few microns deep and a few microns wide. Alternatively, a chemical etching process may be used to remove the transparent conductor over a diameter slightly greater than the via. The etching can be localized, e.g., by printing drops of etchant in the appropriate places using inkjet printing or stencil printing.

A further method for avoiding shorts involves deposition of a thin layer of insulating material on top of the active layer 107 prior to deposition of the transparent conducting layer 109. This insulating layer is preferably several microns thick, and may be in the range of 1 to 100 microns. Since it is deposited only over the area where a via is to be formed (and slightly beyond the borders of the via), its presence does not interfere with the operation of the optoelectronic device. In some embodiments of the present invention, the layer may be similar to structures described in U.S. patent application Ser. No. 10/810,072 to Karl Pichler, filed Mar. 25, 2004, which is hereby incorporated by reference. When a hole is drilled or punched through this structure, there is a layer of insulator between the transparent conducting layer 109 and the bottom electrode 104 which may be relatively thick compared to these layers and to the precision of mechanical cutting processes, so that no short can occur.

The material for this layer can be any convenient insulator, preferably one that can be digitally (e.g. inkjet) printed. Thermoplastic polymers such as Nylon PA6 (melting point (m.p.) 223° C.), acetal (m.p. 165° C.), PBT (structurally similar to PET but with a butyl group replacing the ethyl group) (m.p. 217° C.), and polypropylene (m.p. 165° C.), are examples which by no means exhaust the list of useful materials. These materials may also be used for the insulating layer 122. While inkjet printing is a desirable way to form the insulator islands, other methods of printing or deposition (including conventional photolithography) are also within the scope of the invention.

In forming the vias, it is useful to fabricate the optoelectronic device in at least two initially separate elements, with one comprised of the insulating layer 106, the bottom electrode 104 and the layers 102 above it, and the second comprised of the back plane 108. These two elements are then laminated together after the vias have been formed through the composite structure 106/104/102, but before the vias are filled. After this lamination and via formation, the back plane 108 is laminated to the composite, and the vias are filled as described above.

Although jet-printed solders or conductive adhesives comprise useful materials for forming the conductive via plug 124, it is also possible to form this plug by mechanical means. Thus, for example, a wire of suitable diameter may be placed in the via, forced into contact with the back plane 108, and cut off at the desired height to form the plug 124, in a manner analogous to the formation of gold stud bumps. Alternatively a pre-formed pin of this size can be placed into the hole by a robotic arm. Such pins or wires can be held in place, and their electrical connection to the substrate assisted or assured, by the printing of a very thin layer of conductive adhesive prior to placement of the pin. In this way the problem of long drying time for a thick plug of conductive adhesive is eliminated. The pin can have tips or serrations on it which punch slightly into the back plane 108, further assisting contact. Such pins may be provided with insulation already present, as in the case of insulated wire or coated wire (e.g. by vapor deposition or oxidation). They can be placed in the via before the application of the insulating material, making it easier to introduce this material.

If the pin is made of a suitably hard metal, and has a slightly tapered tip, it may be used to form the via during the punching step. Instead of using a punch or drill, the pin is inserted into the composite 106/104/102, to a depth such that the tip just penetrates the bottom; then when the substrate 108 is laminated to this composite, the tip penetrates slightly into it and forms a good contact. These pins may be injected into the unpunched substrate by, for example, mechanical pressure or air pressure directed through a tube into which the pin just fits.

Figure 2B:
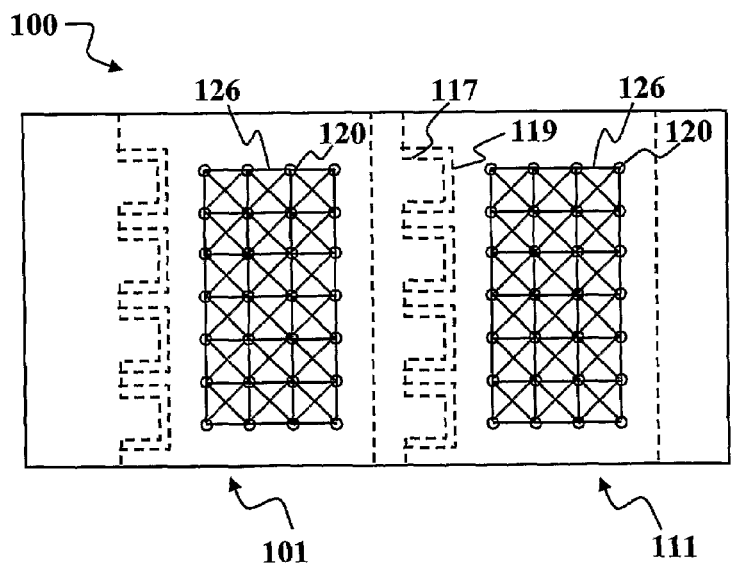
FIG. 2B is a plan view schematic diagram of the array of FIG. 2A.
Figure 2C:
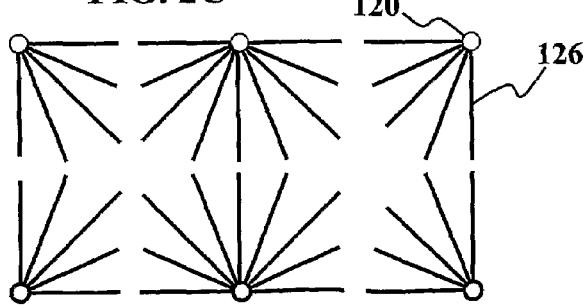
FIGS. 2C-2E are plan view schematic diagrams illustrating alternative trace patterns for an optoelectronic device of the type shown in FIGS. 1A-1B.
Figure 2D:
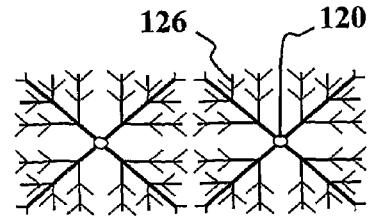
Figure 2E:
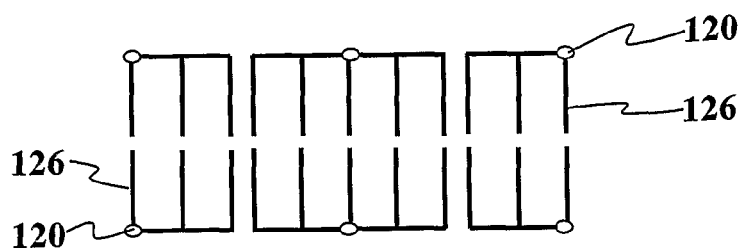

One or more conductive traces 126, e.g., made of Al, Ni, or Ag, may be disposed on the transparent conducting layer 109 in electrical contact with the electrically conductive material 124. As shown in FIG. 2B, the traces 126 may interconnect multiple contacts 120 to reduce the overall sheet resistance. By way of example, the contacts 120 may be spaced about 1 centimeter apart from one another with the traces 126 connecting each contact with its nearest neighbor or in some cases to the transparent conductor surrounding it. Preferably, the number, width and spacing of the traces 126 is chosen such that the contacts 120 and traces 126 cover less than about 1% of the surface of the device module 101. The traces 126 may have a width between about 1 micron and about 200 microns, preferably between about 5 microns and about 50 microns. The traces 126 may be separated by center-to-center distances between about 0.1 millimeter and about 10 millimeters, preferably between about 0.5 millimeter and about 2 millimeters. Wider lines require a larger separation in order to avoid excessive shadowing loss. A variety of patterns or orientations for the traces 126 may be used so long as the lines are approximately equidistant from each other (e.g., to within a factor of two). An alternative pattern in which the traces 126 fan out from the contacts 120 is depicted in FIG. 2C. In another alternative pattern, shown in FIG. 2D, the traces 126 form a "watershed" pattern, in which thinner traces 126 branch out from thicker traces that radiate from the contacts 120. In yet another alternative pattern, shown in FIG. 2E, the traces 126 form a rectangular pattern from the contacts 120. The number of traces 126 connected to each contact may be more or less than the number shown in FIG. 2E. Some embodiments may have one more, two more, three more, or the like. The trace patterns depicted in the examples shown in FIG. 2B, FIG. 2C, FIG. 2D, and FIG. 2E are for the purpose of illustration and do not limit the possible trace patterns that may be used in embodiments of the present invention. Note that since the conductive back planes 108, 118 carry electrical current from one device module to the next the conductive traces 126 can include "fingers" while avoiding thick "busses". This reduces the amount of shadowing due to the busses and also provides a more aesthetically pleasing appearance to the device array 100.

Fabricating the device modules 101, 111 on substrates $S_1$, $S_2$ made of relatively thick, highly conductive, flexible bulk conductor bottom electrodes 104, 114 and backplanes 108, 118 and forming insulated electrical contracts 120 through the transparent conducting layer 109, the active layer 130, the bottom electrodes 104, 114 and the insulating layer 106, 116 allows the device modules 101, 111 to be relatively large. Consequently the array 100 can be made of fewer device modules requiring fewer series interconnections compared to prior art arrays. For example, the device modules 101, 111 may be between about 1 centimeter and about 30 centimeters long and between about 1 and about 30 centimeters wide. Smaller cells (e.g., less than 1 centimeter long and/or 1 centimeter wide) may also be made as desired.

Note that since the back planes 108, 118 carry electric current from one device module to the next, the pattern of traces 126 need not contain thick busses, as used in the prior art for this purpose. Instead, the pattern of traces 126 need only provide sufficiently conductive "fingers" to carry current to the contacts 120. In the absence of busses, a greater portion of the active layers 102, 112 is exposed, which enhances efficiency. In addition, a pattern of traces 126 without busses can be more aesthetically pleasing.

Electrical contact between the back plane 108 of the first device module 101 and the bottom electrode 114 of the second device module 111 may be implemented by cutting back the back plane 118 and insulating layer 116 of the second device module to expose a portion of the bottom electrode 114. FIG. 2B illustrates an example of one way, among others, for cutting back the back plane 118 and insulating layer 116. Specifically, notches 117 may be formed in an edge of the insulating layer 116. The notches 117 align with similar, but slightly larger notches 119 in the back plane 118. The alignment of the notches 117, 119 exposes portions of the bottom electrode 114 of the second device module 111.

Electrical contact may be made between the back plane 108 of the first device module 101 and the exposed portion of the bottom electrode 114 of the second device module 111 in a number of different ways. For example, as shown in FIG. 2A, thin conducting layer 128 may be disposed over a portion of the carrier substrate 103 in a pattern that aligns with the notches 117, 119.

The thin conducting layer may be, e.g., a conductive (filled) polymer or silver ink. The conducting layer can be extremely thin, e.g., about 1 micron thick. A general criteria for determining the minimum thickness of the thin conducting layer 128 is that the fractional power $p=(J/V) \rho(L_o^2/d)$ dissipated in this layer is about $10^{-5}$ or less, where J is the current density, V is the voltage, $L_o$ is the length of the thin conducting layer 128 (roughly the width of the gap between the first and second device modules) and $\rho$ and d are respectively the resistivity and the thickness of the thin conductive layer 128. By way of numerical example, for many applications (J/V) is roughly 0.06 A/Vcm². If $L_o$=400 microns=0.04 cm then p is approximately equal to $10^{-4}$ ($\rho$/d). Thus, even if the resistivity $\rho$ is about $10^{-5}$ $\Omega$cm (which is about ten times less than for a good bulk conductor), d can be about 1 micron ($10^{-4}$ cm) thick. Thus, even a relatively resistive polymer conductor of almost any plausible thickness will work.

The first device module 101 may be attached to the carrier substrate 103 such that the back plane 108 makes electrical contact with the thin conducting layer 128 while leaving a portion of the thin conducting layer 128 exposed. Electrical contact may then be made between the exposed portion of the thin conducting layer 128 and the exposed portion of the bottom electrode 114 of the second device module 111. For example, a bump of conductive material 129 (e.g., more conductive adhesive) may be placed on the thin conducting layer 128 at a location aligned with the exposed portion of the bottom electrode 114. The bump of conductive material 129 is sufficiently tall as to make contact with the exposed portion of the bottom electrode 114 when the second device module 111 is attached to the carrier substrate. The dimensions of the notches 117, 119 may be chosen so that there is essentially no possibility that the thin conducting layer 128 will make undesired contact with the back plane 118 of the second device module 111. For example, the edge of the bottom electrode 114 may be cut back with respect to the insulating layer 116 by an amount of cutback $CB_1$ of about 400 microns. The back plane 118 may be cut back with respect to the insulating layer 116 by an amount $CB_2$ that is significantly larger than $CB_1$.

The device layers 102, 112 are preferably of a type that can be manufactured on a large scale, e.g., in a roll-to-roll processing system. There are a large number of different types of device architectures that may be used in the device layers 102, 112. By way of example, and without loss of generality, the inset in FIG. 2A shows the structure of a CIGS active layer 107 and associated layers in the device layer 102. By way of example, the active layer 107 may include an absorber layer 130 based on materials containing elements of groups IB, IIIA and VIA. Preferably, the absorber layer 130 includes copper (Cu) as the group IB, Gallium (Ga) and/or Indium (In) and/or Aluminum as group IIIA elements and Selenium (Se) and/or Sulfur (S) as group VIA elements. Examples of such materials (sometimes referred to as CIGS materials) are described in U.S. Pat. No. 6,268,014, issued to Eberspacher et al on Jul. 31, 2001, and US Patent Application Publication No. US 2004-0219730 A1 to Bulent Basol, published Nov. 4, 2004, both of which are incorporated herein by reference. A window layer 132 is typically used as a junction partner between the absorber layer 130 and the transparent conducting layer 109. By way of example, the window layer 132 may include cadmium sulfide (CdS), zinc sulfide (ZnS), or zinc selenide (ZnSe) or some combination of two or more of these. Layers of these materials may be deposited, e.g., by chemical bath deposition or chemical surface deposition, to a thickness of about 50 nm to about 100 nm. A layer 134 of a metal different from the bottom electrode may be disposed between the bottom electrode 104 and the absorber layer 130 to inhibit diffusion of metal from the bottom electrode 104. For example, if the bottom electrode 104 is made of aluminum, the layer 134 may be a layer of molybdenum. This may help carry electrical charge and provide certain protective qualities. In addition, another layer 135 of material similar to that of layer 13 may also be applied between the layer 134 and the aluminum layer 104. The material may be the same as that of layer 13 or it may be another material selected from the set of material listed for layer 13. Optionally, another layer 137 also be applied to the other side of layer 104. The material may be the same as that of layer 135 or it may be another material selected from the set of material listed for layer 13. Protective layers similar to layers 135 and/or 137 may be applied around the foil on any of the embodiments described herein, such as but not limited to those of FIGS. 5 and 6.

Although CIGS solar cells are described for the purposes of example, those of skill in the art will recognize that embodiments of the series interconnection technique can be applied to almost any type of solar cell architecture. Examples of such solar cells include, but are not limited to: cells based on amorphous silicon, Graetzel cell architecture (in which an optically transparent film comprised of titanium dioxide particles a few nanometers in size is coated with a monolayer of charge transfer dye to sensitize the film for light harvesting), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Furthermore, embodiments of the series interconnection technique described herein can be used with optoelectronic devices other than solar cells.

Alternatively, the optoelectronic devices 101, 111 may be light emitting devices, such as organic light emitting diodes (OLEDs). Examples of OLEDs include light-emitting polymer (LEP) based devices. In such a case, the active layer 107 may include a layer of poly(3,4) ethylendioxythiophene:polystyrene sulfonate (PEDOT:PSS), which may be deposited to a thickness of typically between 50 and 200 nm on the bottom electrodes 104, 114, e.g., by web coating or the like, and baked to remove water. PEDOT:PSS is available from Bayer Corporation of Leverkusen, Germany. A polyfluorene based LEP may then be deposited on the PEDOT:PSS layer (e.g., by web coating) to a thickness of about 60-70 nm. Suitable polyfluorene-based LEPs are available from Dow Chemicals Company.

The transparent conductive layer 109 may be, e.g., a transparent conductive oxide (TCO) such as zinc oxide (ZnO) or aluminum doped zinc oxide (ZnO:Al), which can be deposited using any of a variety of means including but not limited to sputtering, evaporation, CBD, electroplating, CVD, PVD, ALD, and the like. Alternatively, the transparent conductive layer 109 may include a transparent conductive polymeric layer, e.g. a transparent layer of doped PEDOT (Poly-3,4-Ethylenedioxythiophene), which can be deposited using spin, dip, or spray coating, and the like. PSS:PEDOT is a doped, conducting polymer based on a heterocyclic thiophene ring bridged by a diether. A water dispersion of PEDOT doped with poly(styrenesulfonate) (PSS) is available from H.C. Starck of Newton, Mass. under the trade name of Baytron® P. Baytron® is a registered trademark of Bayer Aktiengesellschaft (hereinafter Bayer) of Leverkusen, Germany. In addition to its conductive properties, PSS:PEDOT can be used as a planarizing layer, which can improve device performance. A potential disadvantage in the use of PEDOT is the acidic character of typical coatings, which may serve as a source through which the PEDOT may chemically attack, react with, or otherwise degrade the other materials in the solar cell. Removal of acidic components in PEDOT may be carried out by anion exchange procedures. Non-acidic PEDOT can be purchased commercially. Alternatively, similar materials can be purchased from TDA materials of Wheat Ridge, Colo., e.g. Oligotron™ and Aedotron™.

The gap between the first device module 101 and the second device module 111 may be filled with a curable polymer epoxy, e.g., silicone. An optional encapsulant layer (not shown) may cover the array 100 to provide environmental resistance, e.g., protection against exposure to water or air. The encapsulant may also absorb UV-light to protect the underlying layers. Examples of suitable encapsulant materials include one or more layers of fluoropolymers such as THV (e.g. Dyneon's THV220 fluorinated terpolymer, a fluorothermoplastic polymer of tetrafluoroethylene, hexafluoropropylene and vinylidene fluoride), Tefzel® (DuPont), Tefdel, ethylene vinyl acetate (EVA), thermoplastics, polyimides, polyamides, nanolaminate composites of plastics and glasses (e.g. barrier films such as those described in commonly-assigned, co-pending U.S. Patent Application Publication US 2005-0095422 A1, to Brian Sager and Martin Roscheisen, entitled "INORGANIC/ORGANIC HYBRID NANOLAMINATE BARRIER FILM" which is incorporated herein by reference), and combinations of the above.

Figure 3:
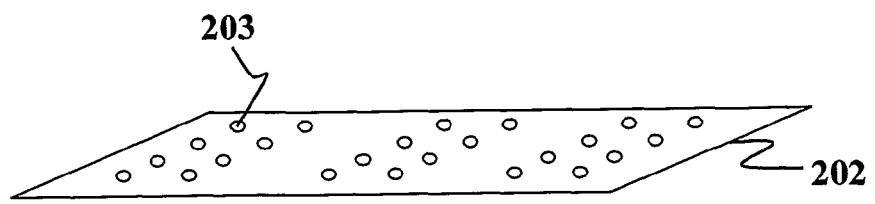
FIG. 3 is a sequence of schematic diagrams illustrating fabrication of an array of optoelectronic devices according to an embodiment of the present invention.
Figure 3:
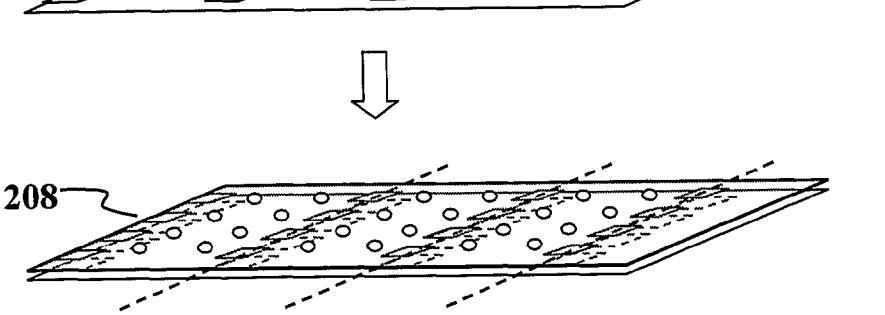
Figure 3:
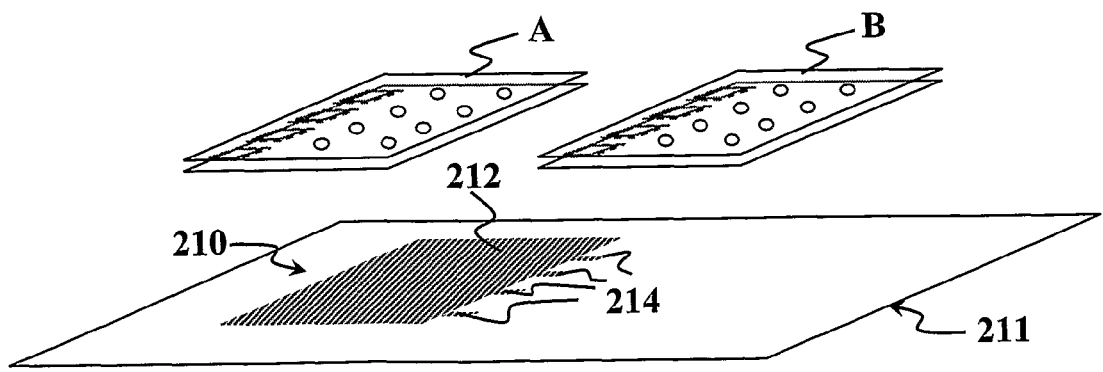

There are a number of different methods of fabricating interconnected devices according to embodiments of the present invention. For example, FIG. 3 illustrates one such method. In this method the devices are fabricated on a continuous device sheet 202 that includes an active layer between a bottom electrode and a transparent conductive layer, e.g., as described above with respect to FIGS. 2A-2B. The device sheet 202 is also patterned with contacts 203 like the contact 120 depicted in FIG. 2A. The contacts 203 may be electrically connected by conductive traces (not shown) as described above. An insulating layer 204 and a back plane 206 are also fabricated as continuous sheets. In the example shown in FIG. 3, the insulating layer 204 has been cut back, e.g., to form notches 205 that align with similar notches 207 in the back plane layer 206. The notches in the back plane layer 206 are larger than the notches in the insulating layer 204. The device sheet 202, insulating layer 204 and back plane layer are laminated together to form a laminate 208 having the insulating layer 204 between the device sheet 202 and the back plane 206. The laminate 208 is then cut into two or more device modules A,B along the dashed lines that intersect the notches 205, 207. A pattern of conductive adhesive 210 (e.g., a conductive polymer or silver ink) is then disposed on a carrier substrate 211. The modules are adhered to the carrier substrate 211. A larger area 212 of the conductive adhesive 210 makes electrical contact with the backplane 206 of module A. Fingers 214 of conductive adhesive 210 project out from the larger area 212. The fingers 214 align with the notches 205, 207 of module B. Extra conductive adhesive may be placed on the fingers 214 to facilitate electrical contact with the bottom electrode of module B through the notches 205, 207. Preferably, the fingers 214 are narrower than the notches 207 in the back plane 206 so that the conductive adhesive 210 does not make undesired electrical contact with the back plane 206 of module B.

Figure 4:
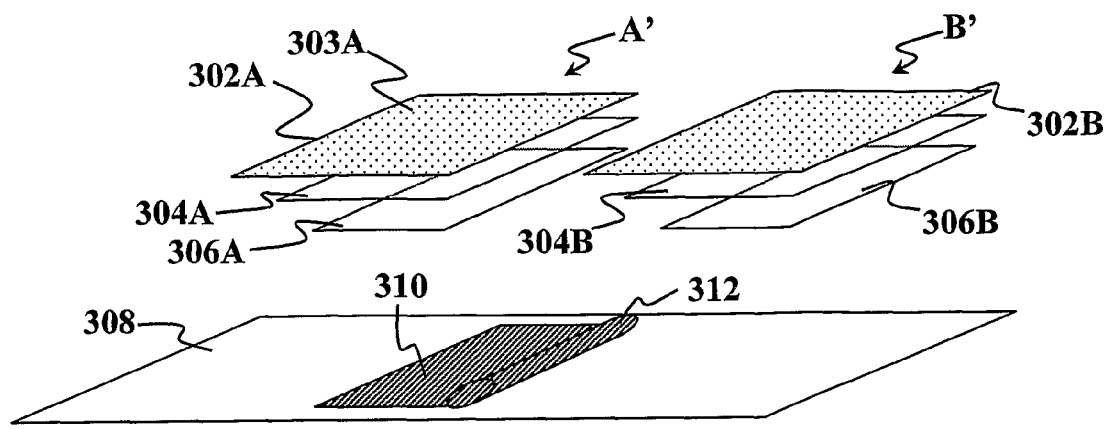
FIG. 4 is an exploded view schematic diagram illustrating fabrication of an array of optoelectronic devices according to an alternative embodiment of the present invention.

In the embodiment depicted in FIG. 3, the device sheet, insulating layer and back plane were laminated together before being cut into individual modules. In alternative embodiments, the layers may be cut first and then assembled into modules (e.g., by lamination). For example, as shown in FIG. 4, first and second device modules A', B' may be respectively laminated from pre-cut device layers 302A, 302B, insulating layers 304A, 304B, and back planes 306A, 306B. Each device layer 302A, 302B includes an active layer between a transparent conducting layer and a bottom electrode. At least one device layer 302A includes electrical contacts 303A (and optional conductive traces) of the type described above.

In this example, the back plane layer 306B of module B has been cut back by simply making it shorter than the insulating layer 304B so that the insulating layer 304B overhangs an edge of the back plane layer 306B. Similarly, the insulating layer 304B has been cut back by making it shorter than the device layer 302B or, more specifically, shorter than the bottom electrode of device layer 302B. After the pre-cut layers have been laminated together to form the modules A', B' the modules are attached to a carrier substrate 308 and electrical connection is made between the back plane 306A of module A' and the bottom electrode of the device layer 302B of module B'. In the example shown in FIG. 4, the connection is made through a conductive adhesive 310 with a raised portion 312, which makes contact with the bottom electrode while avoiding undesired contact with the back plane 306B of module B'.

Figure 5A:
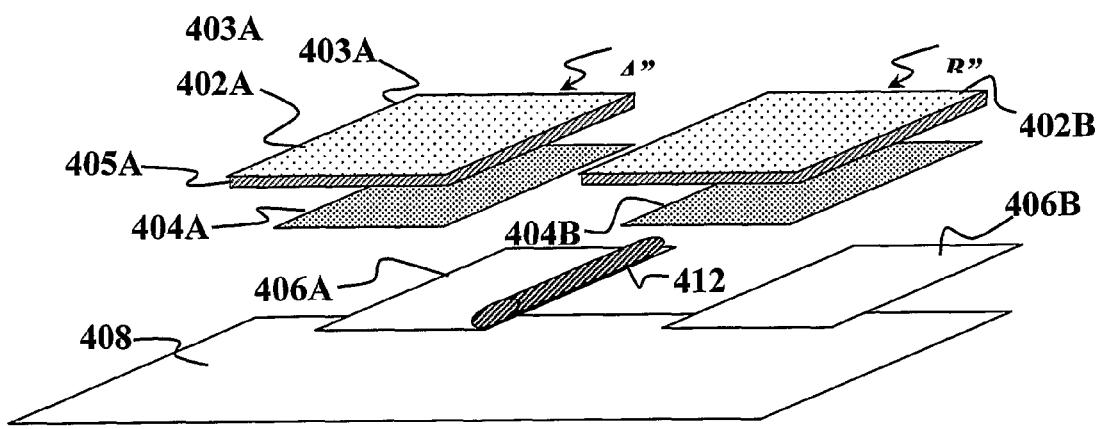
FIG. 5A is an exploded view schematic diagram illustrating fabrication of an array of optoelectronic devices according to another alternative embodiment of the present invention.
Figure 5B:
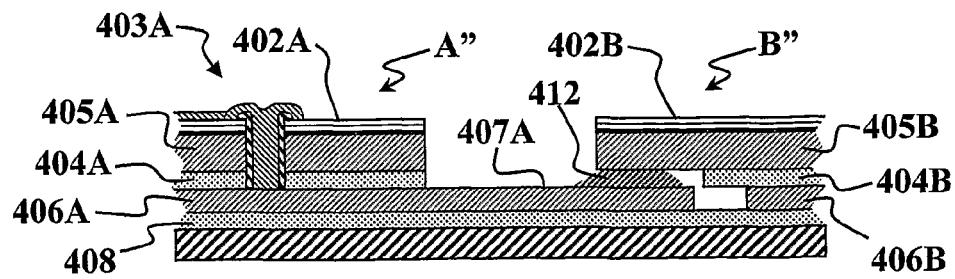
FIG. 5B is a cross-sectional schematic diagram illustrating a portion of the array of FIG. 4A.

FIGS. 5A-5B depict a variation on the method depicted in FIG. 4 that reduces the use of conductive adhesive. First and second device modules A", B" are assembled from pre-cut device layers 402A, 402B, insulating layers 404A, 404B and back plane layers 406A, 406B and attached to a carrier substrate 408. Insulated electrical contacts 403A make electrical contact through the device layers 402A, a bottom electrode 405A and the insulating layer 406A as shown in FIG. 5B. Front edges of the insulating layer 404B and back plane 406B of module B" are cut back with respect to the device layer 402B as described above with respect to FIG. 4. To facilitate electrical contact, however, a back edge of the back plane 406A of module A" extends beyond the back edges of the device layer 402A and insulating layer 404A. As a result, the device layer 402B of module B" overlaps the back plane 406A of module A". A ridge of conductive adhesive 412 on an exposed portion 407A of the back plane 406A makes electrical contact with an exposed portion of a bottom electrode 405B of the device layer 402B as shown in FIG. 5B.

In preferred embodiments of the methods described above, individual modules may be fabricated, e.g., as described above, and then sorted for yield. For example, two or more device modules may be tested for one or more performance characteristics such as optoelectronic efficiency, open circuit voltage, short circuit current, fill factor, etc. Device modules that meet or exceed acceptance criteria for the performance characteristics may be used in an array, while those that fail to meet acceptance criteria may be discarded. Examples of acceptance criteria include threshold values or acceptable ranges for optoelectronic efficiency or open circuit voltage. By sorting the device modules individually and forming them into arrays, higher yields may be obtained than by fabricating arrays of devices monolithically.

Figure 6A:
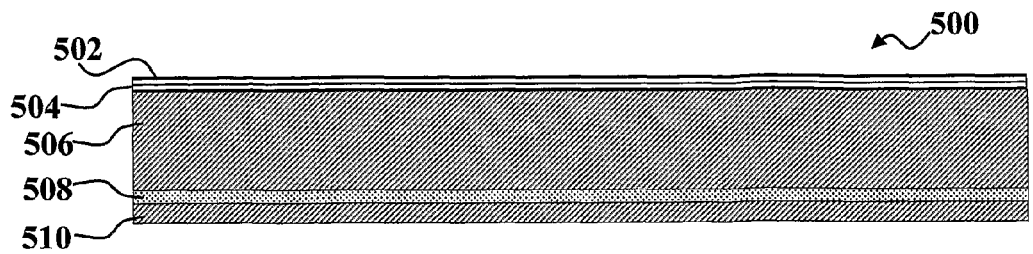
FIGS. 6A-6I are cross-sectional schematic diagrams illustrating formation of electrical contacts according to embodiments of the present invention.

In the discussion of the electrical contacts 120 between the transparent conductive layer and the back plane, vias were formed, coated with an insulating material and filled with a conductive material. In an alternative embodiment, connection between the transparent conductive layer and the back plane may be effected using a portion of the bottom electrode as part of the electrical contact. FIGS. 6A-6H illustrate examples of how this may be implemented. Specifically, one may start with a structure 500 (as shown in FIG. 6A) with a transparent conducting layer 502 (e.g., Al:ZnO, i:ZnO), an active layer 504 (e.g., CIGS), a bottom electrode 506 (e.g., 100 um Al), an insulating layer 508 (e.g., 50 um PET), and a back plane 510 (e.g., 25 um Al). Preferably, the back plane 510 is in the form of a thin aluminum tape that is laminated to the bottom electrode 506 using an insulating adhesive as the insulating layer 508. This can greatly simplify manufacture and reduce materials costs.

Figure 6B:
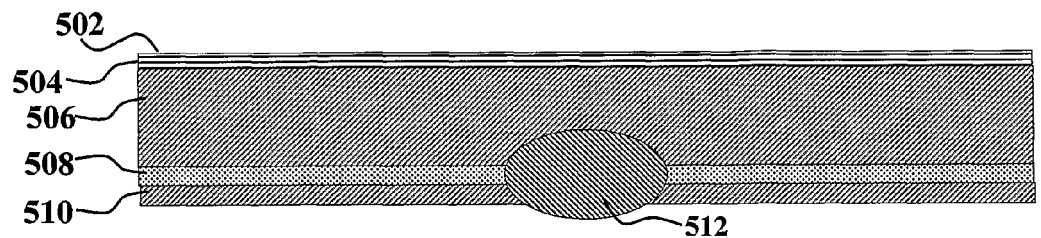

Electrical connection 512 may be made between the bottom electrode 506 and the back plane at one or more locations as shown in FIG. 6B. For example, a spot weld may be formed through insulating layer 508, e.g., using laser welding. Such a process is attractive by virtue of making the electrical connection in a single step. Alternatively, the electrical connection 512 may be formed through a process of drilling a blind hole through the back plane 510 and the insulating layer 508 to the bottom electrode and filling the blind hole with an electrically conductive material such as a solder or conductive adhesive.

Figure 6C:
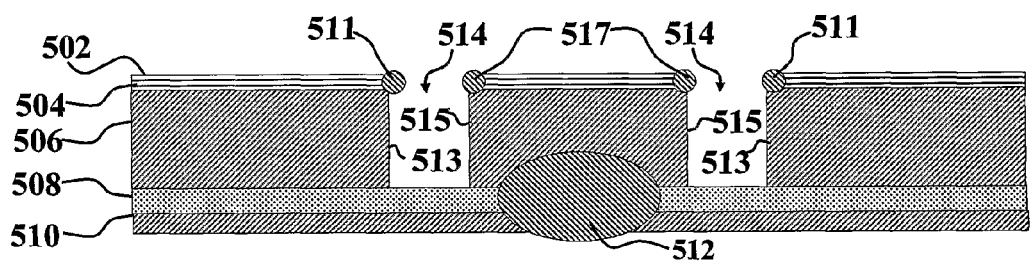

As shown in FIG. 6C, a trench 514 is then formed in a closed loop (e.g., a circle) around the electrical connection 512. The closed-loop trench 514 cuts through the transparent conducting layer 502, active layer 504, and bottom electrode 506, to the back plane 510. The trench 514 isolates a portion of the bottom electrode 506, active layer 504, and transparent conductive layer 502 from the rest of the structure 500. Techniques such as laser machining may be used to form the trench 514. If laser welding forms the electrical connection 512 with one laser beam and a second laser beam forms the trench 514, the two laser beams may be pre-aligned with respect to each other from opposite sides of the structure 500. With the two lasers pre-aligned, the electrical connection 512 and trench 514 may be formed in a single step, thereby enhancing the overall processing speed.

Figure 6D:
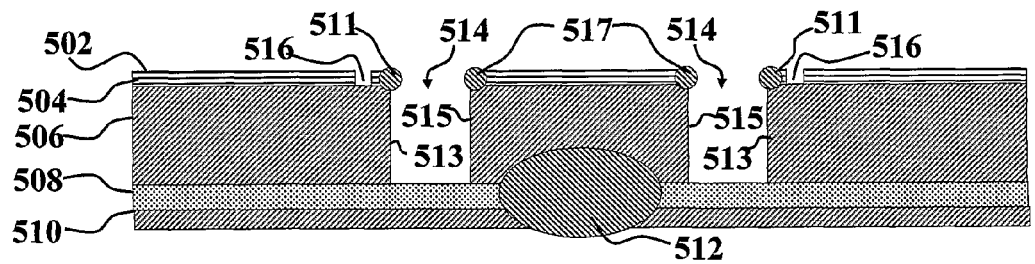

The process of forming the isolation trench may cause electrical short-circuits 511, 517 between the transparent conductive layer 502 and the bottom electrode 506. To electrically isolate undesirable short circuits 511 formed on an outside wall 513 of the trench 514 an isolation trench 516 is formed through the transparent conductive layer and the active layer to the bottom electrode 506 as shown in FIG. 6D. The isolation trench 516 surrounds the closed-loop trench 514 and electrically isolates the short circuits 511 on the outside wall 513 of the trench from the rest of the structure 500. A laser scribing process may form the isolation trench 516. A lesser thickness of material being scribed reduces the likelihood of undesired short circuits resulting from formation of the isolation trench 516.

Figure 6E:
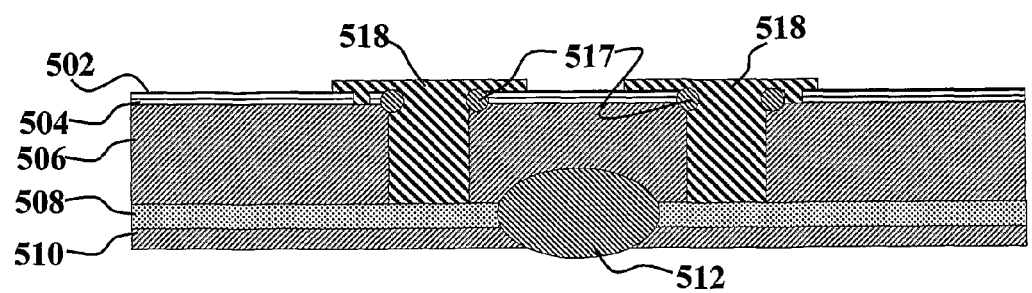
Figure 6F:
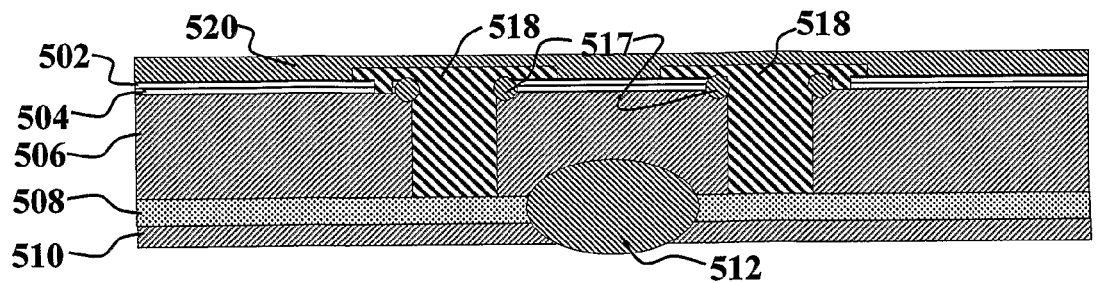

Not all short circuits between the transparent conducting layer 502 and the bottom electrode 506 are undesirable. Electrical shorts 517 along an inside wall 515 of the trench 514 can provide part of a desired electrical path to the electrical connection 512. If a sufficient amount of desirable short circuiting is present, the electrical contact may be completed as depicted in FIG. 6E-6F. First an insulating material 518 is deposited into the closed-loop trench 514 and isolation trench 516 e.g., in a "donut" pattern with a hole in the middle as shown in FIG. 6E. Next electrically conductive fingers 520 are deposited over portions of the structure 500 including the isolated portion surrounded by the trench 514 and non-isolated portions as depicted in FIG. 6F. The insulating material 518 may be deposited in a way that provides a sufficiently planar surface suitable for forming the conductive fingers 520. Electrical contact is then made between the transparent conducting layer 502 in the non-isolated portions outside the trench 514 and the back plane 510 through the fingers 520, the transparent conducting layer within the isolated portion, electrical shorts 517 on the inside wall of the trench 514, the portion of the bottom electrode 506 inside the trench 514 and the electrical connection 512.

Figure 6G:
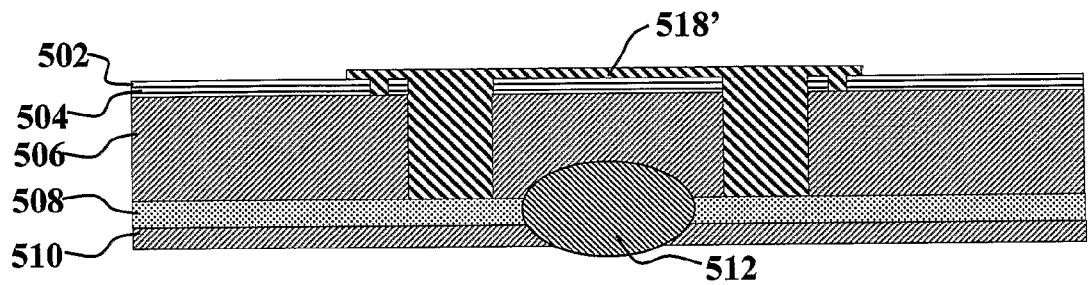
Figure 6H:
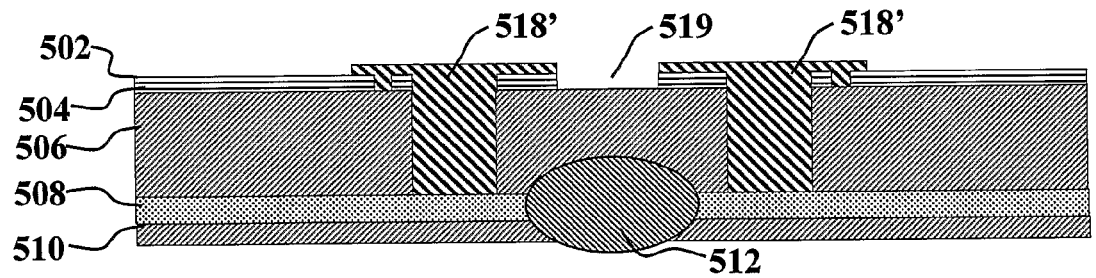
Figure 6I:
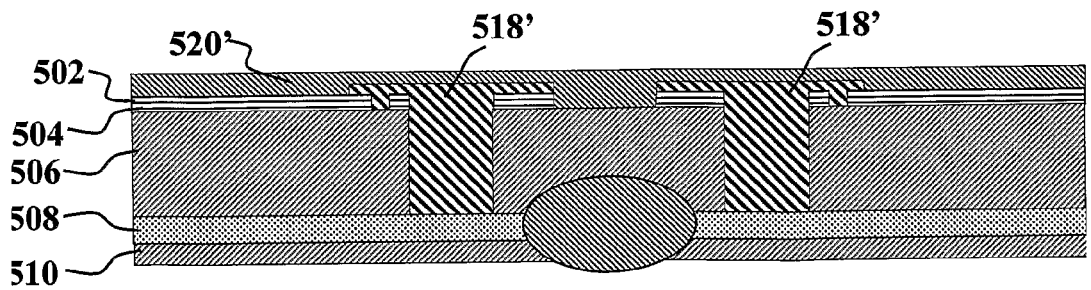

Alternatively, if the shorts 517 do not provide sufficient electrical contact, a process of drilling and filling may provide electrical contact between the fingers 520 and the isolated portion of the bottom electrode 506. In an alternative embodiment depicted in FIGS. 6G-6I, it is possible that insulating material 518' covers the isolated portion when it is deposited as shown in FIG. 6G. The insulating material 518' covering the isolated portion may be removed, e.g., by laser machining or mechanical processes such as drilling or punching, along with corresponding portions of the transparent conductive layer 502 and the active layer 504 to expose the bottom electrode 506 through an opening 519 as shown in FIG. 6H. Electrically conductive material 520' forms conductive fingers, as described above. The electrically conductive material makes contact with the exposed bottom electrode 506 through the opening 519 and completes the desired electrical contact as shown in FIG. 6I.

Note that there are several variations on the techniques described above with respect to FIGS. 6A-6I. For example, in some embodiments it may be desirable to make the electrical connection 512 after the closed-loop trench has been formed and filled with insulating material. There are several advantages of the above-described process for forming the electrical contact. The process steps are simplified. It is easier to deposit the insulating layer without worrying about covering up the back plane. The process allows for a planar surface for depositing the fingers 520, 520'. Reliable electrical contact can be made between the bottom electrode 506 and the back plane 510 through laser welding. Furthermore, electrical shorts can be isolated without jeopardizing a 100% yield.

Embodiments of the present invention facilitate relatively low cost manufacture of large-scale arrays of series-connected optoelectronic devices. Larger devices may be connected in series due to the reduced sheet resistance as a result of the connection between back planes and the transparent conducting layers through the contacts that penetrate the layers of the device modules. The conductive traces can further reduce sheet resistance. Larger devices can be arrayed with fewer connections.

Although for the purpose of illustration, the examples described herein show only two optoelectronic device modules connected in series, it will be appreciated that three or more such device modules may be so connected in accordance with embodiments of the present invention.

The gap between the first device module 101 and the second device module 111 may be filled with a curable polymer, e.g. epoxy or silicone. An optional encapsulant layer (not shown) may cover the array 100 to provide environmental resistance, e.g., protection against exposure to water or air. The encapsulant may also absorb UV-light to protect the underlying layers. Examples of suitable encapsulant materials include one or more layers of fluoropolymers such as THV (e.g. Dyneon's THV220 fluorinated terpolymer, a fluorothermoplastic polymer of tetrafluoroethylene, hexafluoropropylene and vinylidene fluoride), Tefzel® (DuPont), Tefdel, ethylene vinyl acetate (EVA), thermoplastics, polyimides, polyamides, nanolaminate composites of plastics and glasses (e.g. barrier films such as those described in commonly-assigned, co-pending U.S. Patent Application Publication US 2005-0095422 A1, to Brian Sager and Martin Roscheisen, entitled "INORGANIC/ORGANIC HYBRID NANOLAMINATE BARRIER FILM" which is incorporated herein by reference), and combinations of the above.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. Specifically, the following applications are incorporated herein by reference: U.S. patent application Ser. No. 10/943,685, entitled "Formation of CIGS Absorber Layers on Foil Substrates", filed Sep. 18, 2004; U.S. patent application Ser. No. 11/039,053, entitled "Series Interconnected Optoelectronic Device Module Assembly", filed Jan. 20, 2005; U.S. patent application Ser. No. 11/039,053, entitled "Optoelectronic Architecture Having Compound Conducting Substrate", filed Aug. 16, 2005; and U.S. patent application Ser. No. 10/771,250 entitled "Photovoltaic Devices Fabricated from Insulating Template with Conductive Coating" filed on Feb. 2, 2004.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method comprising:
providing a substrate comprising of at least one electrically conductive aluminum foil substrate;
forming an absorber layer on the substrate, wherein the substrate further comprises:
at least one electrically conductive diffusion barrier layer on a first surface of the aluminum foil substrate, and at least one electrically conductive metal layer between the diffusion barrier layer and the absorber layer, wherein the diffusion barrier layer prevents chemical interaction between the aluminum foil substrate and the electrically conductive metal layer and further comprising a second electrically conductive diffusion barrier layer on a second surface of the aluminum foil substrate; and
adding a metal foil to the aluminum foil substrate, wherein an electrically insulating layer is positioned therebetween.

2. The method of claim 1 wherein the absorber layer comprises a non-silicon absorber layer.

3. The method of claim 1 wherein the absorber layer comprises an amorphous silicon absorber layer.

4. The method of claim 1 wherein the absorber layer includes one or more inorganic materials from the group consisting of: titania ($TiO_2$), nanocrystalline $TiO_2$, zinc oxide (ZnO), copper oxide (CuO or $Cu_2O$ or $Cu_xO_y$), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium suflide (CdS), copper sulfide ($Cu_2S$), cadmium telluride (CdTe), cadmium-tellurium selenide (CdTeSe), copper-indium selenide ($CuInSe_2$), cadmium oxide ($CdO_x$), CuI, CuSCN, a semiconductive material, or combinations of the above.

5. The method of claim 1 wherein the absorber layer includes one or more organic materials from the group consisting of: a conjugated polymer, poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof, 2,2'7,7'tetrakis(N,N-di-p-methoxyphenyl-amine)-9,9'-spirobifluorene(spiro-Me OTAD), organometallic polymers, polymers containing perylene units, poly(squaraines) and their derivatives, and discotic liquid crystals, organic pigments or dyes, a Ruthenium-based dye, a liquid iodide/triiodide electrolyte, azo-dyes having azo chromofores (—N═N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f'] diisoquinoline-1,3,8,10-tetrone and pentacene, pentacene derivatives and/or pentacene precursors, an N-type ladder polymer, poly(benzimidazobenzophenanthroline ladder) (BBL), or combinations of the above.

6. The method of claim 1 wherein the absorber layer includes one or more materials from the group consisting of: an oligimeric material, micro-crystalline silicon, inorganic nanorods dispersed in an organic matrix, inorganic tetrapods dispersed in an organic matrix, quantum dot materials, ionic conducting polymer gels, sol-gel nanocomposites containing an ionic liquid, ionic conductors, low molecular weight organic hole conductors, $C_{60}$ and/or other small molecules, or combinations of the above.

7. The method of claim 1 wherein the absorber layer comprises of one of the following: a nanostructured layer having an inorganic porous template with pores filled by an organic material (doped or undoped), a polymer/blend cell architecture, a micro-crystalline silicon cell architecture, or combinations of the above.

8. The method of claim 1 wherein the forming step comprises first forming a nascent absorber layer.

9. The method of claim 8 further comprising reacting the nascent absorber layer to form a dense film.

10. The method of claim 8 further comprising heating the nascent absorber layer to form a dense film.

11. The method of claim 1 wherein the diffusion barrier layer inhibits inter-diffusion of aluminum in the foil substrate and metal in the electrode layer during heating.

12. The method of claim 1 wherein the diffusion barrier layer includes one or more of the following: chromium, vanadium, tungsten, glass, nitrides, tantalum nitride, tungsten nitride, titanium nitride, zirconium nitride, hafnium nitride, silicon nitride, oxides, carbides, or combinations of the above.

13. The method of claim 1 wherein the second diffusion barrier layer is coupled to the substrate.

14. The method of claim 13 wherein the second diffusion barrier layer includes one or more of the following: chromium, vanadium, tungsten, glass, nitrides, tantalum nitride, tungsten nitride, titanium nitride, zirconium nitride, hafnium nitride, silicon nitride, oxides, carbides, or combinations of the above.

15. The method of claim 1 wherein the electrically conductive metal layer comprises of molybdenum.

16. The method of claim 1 wherein the electrically conductive metal layer comprises of copper, silver, aluminum, and niobium.

17. A photovoltaic device, comprising:
a substrate comprising of at least one electrically conductive aluminum foil substrate;
an absorber layer on the substrate, wherein the substrate further comprises:
at least one electrically conductive diffusion barrier layer on a first surface of the aluminum foil substrate, and at least one electrically conductive metal layer between the diffusion barrier layer and the absorber layer, wherein the diffusion barrier layer prevents chemical interaction between the aluminum foil substrate and the electrically conductive metal layer, and further comprising a second electrically conductive diffusion barrier layer on a second surface of the aluminum foil substrate; and
a metal foil coupled to the aluminum foil substrate, wherein an electrically insulating layer is positioned therebetween.

18. The device of claim 17 wherein the absorber layer comprises a non-silicon absorber layer.

19. The device of claim 17 wherein the absorber layer comprises an amorphous silicon absorber layer.

20. The device of claim 17 wherein the absorber layer includes one or more inorganic materials from the group consisting of: titania ($TiO_2$), nanocrystalline $TiO_2$, zinc oxide (ZnO), copper oxide (CuO or $Cu_2O$ or $Cu_xO_y$), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium suflide (CdS), copper sulfide ($Cu_2S$), cadmium telluride (CdTe), cadmium-tellurium selenide (CdTeSe), copper-indium selenide ($CuInSe_2$), cadmium oxide ($CdO_x$), CuI, CuSCN, a semiconductive material, or combinations of the above.

21. The device of claim 17 wherein the absorber layer includes one or more organic materials from the group consisting of: a conjugated polymer, poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof, 2,2'7,7'tetrakis(N,N-di-p-methoxyphenyl-amine)-9,9'-spirobifluorene(spiro-Me OTAD), organometallic polymers, polymers containing perylene units, poly(squaraines) and their derivatives, and discotic liquid crystals, organic pigments or dyes, a Ruthenium-based dye, a liquid iodide/triiodide electrolyte, azo-dyes having azo chromofores (—N═N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f'] diisoquinoline-1,3,8,10-tetrone and pentacene, pentacene derivatives and/or pentacene precursors, an N-type ladder polymer, poly(benzimidazobenzophenanthroline ladder) (BBL), or combinations of the above.

22. The device of claim 17 wherein the absorber layer includes one or more materials from the group consisting of: an oligimeric material, micro-crystalline silicon, inorganic nanorods dispersed in an organic matrix, inorganic tetrapods dispersed in an organic matrix, quantum dot materials, ionic conducting polymer gels, sol-gel nanocomposites containing an ionic liquid, ionic conductors, low molecular weight organic hole conductors, $C_{60}$ and/or other small molecules, or combinations of the above.

23. The device of claim 17 wherein the absorber layer comprises of one of the following: a nanostructured layer having an inorganic porous template with pores filled by an organic material (doped or undoped), a polymer/blend cell architecture, a micro-crystalline silicon cell architecture, or combinations of the above.

24. The device of claim 17 wherein the second diffusion barrier layer is coupled to the substrate.

25. The device of claim 17 wherein the diffusion barrier layer includes one or more of the following: chromium, vanadium, tungsten, glass, nitrides, tantalum nitride, tungsten nitride, titanium nitride, zirconium nitride, hafnium nitride, silicon nitride, oxides, carbides, or combinations of the above.

26. The device of claim 24 wherein the second diffusion barrier layer includes one or more of the following: chromium, vanadium, tungsten, glass, nitrides, tantalum nitride, tungsten nitride, titanium nitride, zirconium nitride, hafnium nitride, silicon nitride, oxides, carbides, or combinations of the above.

27. A method for forming a photovoltaic device, comprising the steps of:
providing a substrate comprising of at least one electrically conductive metallized polymer foil substrate;
forming an absorber layer on the substrate, wherein the substrate further comprises:
at least one electrically conductive diffusion barrier layer on a first surface of the metallized polymer foil substrate, and at least one electrically conductive back metal layer between the diffusion barrier layer and the absorber layer, wherein the diffusion barrier layer prevents chemical interaction between the metallized polymer foil substrate and the back electrically conductive metal layer and further comprising a second electrically conductive diffusion barrier layer on a second surface of the metallized polymer foil substrate;
and
adding a metal foil to the metallized polymer foil substrate, wherein an electrically insulating layer is positioned therebetween.

28. The method of claim 27 wherein the absorber layer comprises a non-silicon absorber layer.

29. The method of claim 27 wherein the absorber layer comprises an amorphous silicon absorber layer.

30. The method of claim 27 wherein the absorber layer includes one or more inorganic materials from the group consisting of: titania ($TiO_2$), nanocrystalline $TiO_2$, zinc oxide (ZnO), copper oxide (CuO or $Cu_2O$ or $Cu_xO_y$), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium suflide (CdS), copper sulfide ($Cu_2S$), cadmium telluride (CdTe), cadmium-tellurium selenide (CdTeSe), copper-indium selenide ($CuInSe_2$), cadmium oxide ($CdO_x$), CuI, CuSCN, a semiconductive material, or combinations of the above.

31. The method of claim 27 wherein the absorber layer includes one or more organic materials from the group consisting of: a conjugated polymer, poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof, 2,2'7,7'tetrakis(N,N-di-p-methoxyphenyl-amine)-9,9'-spirobifluorene(spiro-Me OTAD), organometallic polymers, polymers containing perylene units, poly(squaraines) and their derivatives, and discotic liquid crystals, organic pigments or dyes, a Ruthenium-based dye, a liquid iodide/triiodide electrolyte, azo-dyes having azo chromofores (—N=N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f'] diisoquinoline-1,3,8,10-tetrone and pentacene, pentacene derivatives and/or pentacene precursors, an N-type ladder polymer, poly(benzimidazobenzophenanthroline ladder) (BBL), or combinations of the above.

32. The method of claim 27 wherein the absorber layer includes one or more materials from the group consisting of: an oligimeric material, micro-crystalline silicon, inorganic nanorods dispersed in an organic matrix, inorganic tetrapods dispersed in an organic matrix, quantum dot materials, ionic conducting polymer gels, sol-gel nanocomposites containing an ionic liquid, ionic conductors, low molecular weight organic hole conductors, $C_{60}$ and/or other small molecules, or combinations of the above.

33. The method of claim 27 wherein the absorber layer comprises of one of the following: a nanostructured layer having an inorganic porous template with pores filled by an organic material (doped or undoped), a polymer/blend cell architecture, a micro-crystalline silicon cell architecture, or combinations of the above.

34. The method of claim 27 wherein the foil substrate is a polymer selected from the group of polyesters, polyethylene naphtalates, polyetherimides, polyethersulfones, polyeheretherketones, polyimides, and/or combinations of the above.

35. The method of claim 27 wherein a metal used for metallization of the polymer foil substrate is aluminum or an alloy of aluminum with one or more metals.

36. The method of claim 27 wherein the forming step comprises first forming a nascent absorber layer.

37. The method of claim 36 further comprising reacting the nascent absorber layer to form a dense film.

38. The method of claim 27 wherein the second diffusion barrier layer is coupled to the substrate.

39. The method of claim 27 wherein the diffusion barrier layer includes one or more of the following: chromium, vanadium, tungsten, glass, nitrides, tantalum nitride, tungsten nitride, titanium nitride, zirconium nitride, hafnium nitride, silicon nitride, oxides, carbides, or combinations of the above.

40. The method of claim 38 wherein the second diffusion barrier layer includes one or more of the following: chromium, vanadium, tungsten, glass, nitrides, tantalum nitride, tungsten nitride, titanium nitride, zirconium nitride, hafnium nitride, silicon nitride, oxides, carbides, or combinations of the above.

41. A photovoltaic device, comprising:
a substrate comprising of at least one electrically conductive aluminum foil substrate;

an absorber layer on the substrate, wherein the substrate further comprises:
at least one electrically conductive diffusion barrier layer on a first surface of the aluminum foil substrate, and at least one electrically conductive back metal layer between the diffusion barrier layer and the absorber layer, wherein the diffusion barrier layer prevents chemical interaction between the aluminum foil substrate and the back electrically conductive metal layer, and further comprising a second electrically conductive diffusion barrier layer on a second surface of the aluminum foil substrate; and
a metal foil coupled to the aluminum foil substrate, wherein an electrically insulating layer is positioned therebetween.

42. The device of claim 41 wherein the absorber layer comprises a non-silicon absorber layer.

43. The device of claim 41 wherein the absorber layer comprises an amorphous silicon absorber layer.

44. The device of claim 41 wherein the absorber layer includes one or more inorganic materials from the group consisting of: titania ($TiO_2$), nanocrystalline $TiO_2$, zinc oxide (ZnO), copper oxide (CuO or $Cu_2O$ or $Cu_xO_y$), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium suflide (CdS), copper sulfide ($Cu_2S$), cadmium telluride (CdTe), cadmium-tellurium selenide (CdTeSe), copper-indium selenide ($CuInSe_2$), cadmium oxide ($CdO_x$), CuI, CuSCN, a semiconductive material, or combinations of the above.

45. The device of claim 41 wherein the absorber layer includes one or more organic materials from the group consisting of: a conjugated polymer, poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof, 2,2'7,7'tetrakis(N,N-di-p-methoxyphenyl-amine)-9,9'-spirobifluorene(spiro-Me OTAD), organometallic polymers, polymers containing perylene units, poly(squaraines) and their derivatives, and discotic liquid crystals, organic pigments or dyes, a Ruthenium-based dye, a liquid iodide/triiodide electrolyte, azo-dyes having azo chromofores (—N═N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10d'e'f']diisoquinoline-1,3,8,10-tetrone and pentacene, pentacene derivatives and/or pentacene precursors, an N-type ladder polymer, poly(benzimidazobenzophenanthroline ladder) (BBL), or combinations of the above.

46. The device of claim 41 wherein the absorber layer includes one or more materials from the group consisting of: an oligimeric material, micro-crystalline silicon, inorganic nanorods dispersed in an organic matrix, inorganic tetrapods dispersed in an organic matrix, quantum dot materials, ionic conducting polymer gels, sol-gel nanocomposites containing an ionic liquid, ionic conductors, low molecular weight organic hole conductors, $C_{60}$ and/or other small molecules, or combinations of the above.

47. The device of claim 41 wherein the absorber layer comprises of one of the following: a nanostructured layer having an inorganic porous template with pores filled by an organic material (doped or undoped), a polymer/blend cell architecture, a micro-crystalline silicon cell architecture, or combinations of the above.

48. The device of claim 41 wherein the second diffusion barrier layer is coupled to the substrate.

49. The device of claim 41 wherein the diffusion barrier layer includes one or more of the following: chromium, vanadium, tungsten, glass, nitrides, tantalum nitride, tungsten nitride, titanium nitride, zirconium nitride, hafnium nitride, silicon nitride, oxides, carbides, or combinations of the above.

50. The device of claim 48 wherein the second diffusion barrier layer includes one or more of the following: chromium, vanadium, tungsten, glass, nitrides, tantalum nitride, tungsten nitride, titanium nitride, zirconium nitride, hafnium nitride, silicon nitride, oxides, carbides, or combinations of the above.

* * * * *